US009223925B2

(12) United States Patent
Krishnan et al.

(10) Patent No.: US 9,223,925 B2
(45) Date of Patent: Dec. 29, 2015

(54) METHODS, SYSTEMS, AND ARTICLES OF MANUFACTURE FOR IMPLEMENTING ELECTRONIC CIRCUIT DESIGNS WITH SIMULATION AWARENESS

(71) Applicant: Cadence Design Systems, Inc., San Jose, CA (US)

(72) Inventors: Prakash Krishnan, Wayne, NJ (US); Michael McSherry, Portland, OR (US); David White, San Jose, CA (US); Ed Fischer, Salem, OR (US); Bruce Yanagida, Snohomish, WA (US); Keith Dennison, Edinburgh (GB)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 14/247,236

(22) Filed: Apr. 7, 2014

(65) Prior Publication Data

US 2014/0237440 A1    Aug. 21, 2014

Related U.S. Application Data

(62) Division of application No. 12/982,790, filed on Dec. 30, 2010, now Pat. No. 8,694,933.

(60) Provisional application No. 61/367,398, filed on Jul. 24, 2010, provisional application No. 61/367,412, (Continued)

(51) Int. Cl.
*G06F 17/50* (2006.01)

(52) U.S. Cl.
CPC ........ *G06F 17/5081* (2013.01); *G06F 17/5068* (2013.01)

(58) Field of Classification Search
CPC ............ G06F 17/5009; G06F 17/5022; G06F 17/5027; G06F 17/5036; G06F 17/5045; G06F 17/5081; G06F 2217/82
USPC .......... 716/103–107, 110–111, 115, 123, 100
See application file for complete search history.

(56) References Cited

U.S. PATENT DOCUMENTS

| 4,817,012 A | 3/1989 | Cali' |
| 5,469,366 A | 11/1995 | Yang et al. |

(Continued)

FOREIGN PATENT DOCUMENTS

| TW | 200405210 A | 4/2004 |
| TW | I262411 B | 9/2006 |

(Continued)

OTHER PUBLICATIONS

Foreign Office Action dated May 14, 2015 for Taiwanese Appln. No. 100126052.

(Continued)

*Primary Examiner* — Paul Dinh
(74) *Attorney, Agent, or Firm* — Vista IP Law Group, LLP

(57) ABSTRACT

Disclosed are methods, systems, and articles of manufacture for implementing electronic designs with simulation awareness. A schematic is identified or created and simulated at the schematic level to characterize the functional behavior of the circuit or to ensure the circuit design meets the required design specifications. Physical data of a component of the design is identified, created, or updated, and the electrical parasitic associated with physical data is characterized. One or more electrical characteristics associated with the parasitic is further characterized and mapped to the simulator to re-simulate the circuit design to analyze the impact of parasitics. Some embodiments re-run the same simulation process incrementally in an interactive manner by accepting incremental design or parameter changes from the design environment.

27 Claims, 24 Drawing Sheets

Related U.S. Application Data filed on Jul. 24, 2010, provisional application No. 61/367,404, filed on Jul. 24, 2010, provisional application No. 61/367,407, filed on Jul. 24, 2010, provisional application No. 61/367,410, filed on Jul. 24, 2010, provisional application No. 61/367,406, filed on Jul. 24, 2010.

(56) References Cited

U.S. PATENT DOCUMENTS

| | | |
|---|---|---|
| 5,553,002 A | 9/1996 | Dangelo et al. |
| 5,629,857 A | 5/1997 | Brennan |
| 5,801,958 A | 9/1998 | Dangelo et al. |
| 5,872,952 A | 2/1999 | Tuan et al. |
| 5,999,726 A | 12/1999 | Ho |
| 6,072,945 A | 6/2000 | Aji et al. |
| 6,131,182 A | 10/2000 | Beakes et al. |
| 6,378,110 B1 | 4/2002 | Ho |
| 6,438,729 B1 | 8/2002 | Ho |
| 6,449,578 B1 | 9/2002 | McBride |
| 6,470,482 B1 | 10/2002 | Rostoker et al. |
| 6,499,130 B1 | 12/2002 | Lipton et al. |
| 6,507,932 B1 | 1/2003 | Landry et al. |
| 6,523,150 B1 | 2/2003 | Buffet et al. |
| 6,539,533 B1 | 3/2003 | Brown et al. |
| 6,553,554 B1 | 4/2003 | Dahl et al. |
| 6,584,606 B1 | 6/2003 | Chiu et al. |
| 6,643,836 B2 | 11/2003 | Wheeler et al. |
| 6,665,845 B1 | 12/2003 | Aingaran et al. |
| 6,701,508 B1 | 3/2004 | Bartz et al. |
| 6,842,714 B1 | 1/2005 | Acar et al. |
| 6,877,148 B1 | 4/2005 | Hassibi et al. |
| 6,910,200 B1 | 6/2005 | Aubel et al. |
| 6,954,915 B2 | 10/2005 | Batchelor |
| 6,971,074 B2 | 11/2005 | Hasegawa et al. |
| 6,981,238 B1* | 12/2005 | Churchill ............... 716/115 |
| 7,016,794 B2 | 3/2006 | Schultz |
| 7,020,853 B2 | 3/2006 | Skoll et al. |
| 7,069,526 B2 | 6/2006 | Schubert et al. |
| 7,076,410 B1 | 7/2006 | Kerzman et al. |
| 7,089,129 B2 | 8/2006 | Habitz |
| 7,152,215 B2 | 12/2006 | Smith et al. |
| 7,159,202 B2 | 1/2007 | Lee et al. |
| 7,178,118 B2 | 2/2007 | Ramachandran et al. |
| 7,181,383 B1 | 2/2007 | McGaughy et al. |
| 7,206,731 B2 | 4/2007 | Sercu et al. |
| 7,228,514 B2 | 6/2007 | Chan et al. |
| 7,243,317 B2 | 7/2007 | Wang et al. |
| 7,249,340 B2 | 7/2007 | Cooke et al. |
| 7,251,800 B2 | 7/2007 | McElvain et al. |
| 7,278,120 B2 | 10/2007 | Rahmat et al. |
| 7,331,029 B2 | 2/2008 | Amit et al. |
| 7,347,621 B2 | 3/2008 | Sri-Jayantha et al. |
| 7,356,784 B1 | 4/2008 | Dengi et al. |
| 7,383,521 B2 | 6/2008 | Smith et al. |
| 7,395,519 B2 | 7/2008 | Kawata |
| 7,559,045 B2 | 7/2009 | Chen et al. |
| 7,567,894 B2 | 7/2009 | Durand et al. |
| 7,574,682 B2 | 8/2009 | Riviere-Cazaux |
| 7,596,771 B2 | 9/2009 | Cohen et al. |
| 7,640,527 B1 | 12/2009 | Doraira et al. |
| 7,797,646 B2 | 9/2010 | Chung et al. |
| 7,802,222 B2 | 9/2010 | Arsintescu |
| 7,805,698 B1 | 9/2010 | Ferguson et al. |
| 7,810,063 B1 | 10/2010 | Sharma et al. |
| 7,818,697 B2 | 10/2010 | Cho |
| 7,904,852 B1 | 3/2011 | Cadouri et al. |
| 7,941,768 B1 | 5/2011 | Wei |
| 7,966,588 B1 | 6/2011 | Perry et al. |
| 8,141,013 B2 | 3/2012 | Woods et al. |
| 8,150,638 B1 | 4/2012 | Wu et al. |
| 8,185,856 B2 | 5/2012 | Izuha |
| 8,224,636 B2 | 7/2012 | Kundert |
| 8,261,228 B1 | 9/2012 | Gopalakrishnan et al. |
| 2002/0166102 A1 | 11/2002 | Du et al. |
| 2002/0188920 A1 | 12/2002 | Lampaert et al. |
| 2003/0131323 A1 | 7/2003 | McConaghy |
| 2004/0049747 A1 | 3/2004 | Yamasaki et al. |
| 2004/0078767 A1 | 4/2004 | Burks et al. |
| 2004/0111688 A1* | 6/2004 | Lee et al. ............... 716/12 |
| 2004/0117748 A1 | 6/2004 | Tester |
| 2004/0117750 A1 | 6/2004 | Skoll et al. |
| 2004/0128368 A1 | 7/2004 | Sakai |
| 2004/0128638 A1 | 7/2004 | Kerzman et al. |
| 2004/0143809 A1 | 7/2004 | Cowan et al. |
| 2004/0243949 A1 | 12/2004 | Wang et al. |
| 2005/0010922 A1 | 1/2005 | Czajkowski et al. |
| 2005/0114818 A1 | 5/2005 | Khakzadi et al. |
| 2005/0216873 A1 | 9/2005 | Singh et al. |
| 2005/0268258 A1 | 12/2005 | Decker |
| 2005/0268269 A1 | 12/2005 | Coiley |
| 2005/0273732 A1 | 12/2005 | Xu et al. |
| 2005/0278665 A1 | 12/2005 | Gentry et al. |
| 2006/0095884 A1 | 5/2006 | Skoll et al. |
| 2006/0095889 A1 | 5/2006 | Cote et al. |
| 2006/0101368 A1 | 5/2006 | Kesarwani et al. |
| 2006/0123364 A1 | 6/2006 | Cook et al. |
| 2007/0094622 A1 | 4/2007 | Lee et al. |
| 2007/0106969 A1 | 5/2007 | Birch et al. |
| 2007/0118827 A1 | 5/2007 | Rahman |
| 2007/0234266 A1 | 10/2007 | Chen et al. |
| 2007/0245274 A1 | 10/2007 | Kimura |
| 2007/0288881 A1 | 12/2007 | Maheshwarla et al. |
| 2007/0299647 A1 | 12/2007 | Bolcato et al. |
| 2008/0022251 A1 | 1/2008 | McConaghy et al. |
| 2008/0034336 A1 | 2/2008 | Hirano |
| 2008/0086709 A1 | 4/2008 | Rittman |
| 2008/0133201 A1 | 6/2008 | Guedon |
| 2008/0148195 A1 | 6/2008 | Chan et al. |
| 2008/0209365 A1 | 8/2008 | Riviere-Cazaux |
| 2008/0244497 A1 | 10/2008 | Zhao et al. |
| 2008/0244498 A1 | 10/2008 | Gupta et al. |
| 2009/0019411 A1 | 1/2009 | Chandra et al. |
| 2009/0031261 A1 | 1/2009 | Smith et al. |
| 2009/0089733 A1 | 4/2009 | Chang et al. |
| 2009/0144042 A1 | 6/2009 | Lorenz et al. |
| 2009/0150842 A1 | 6/2009 | Kemerer et al. |
| 2009/0254874 A1 | 10/2009 | Bose |
| 2009/0265672 A1 | 10/2009 | St. John et al. |
| 2010/0083200 A1 | 4/2010 | Song et al. |
| 2010/0217577 A1 | 8/2010 | Korobkov et al. |
| 2011/0107293 A1 | 5/2011 | Ganzhorn et al. |
| 2011/0197170 A1 | 8/2011 | Chandramohan et al. |
| 2011/0314437 A1 | 12/2011 | Mcilrath |
| 2012/0022846 A1 | 1/2012 | White et al. |
| 2012/0023465 A1 | 1/2012 | Gopalakrishnan et al. |
| 2012/0023467 A1 | 1/2012 | McSherry et al. |
| 2012/0117530 A1 | 5/2012 | Green |

FOREIGN PATENT DOCUMENTS

| | | |
|---|---|---|
| TW | 200820613 A | 5/2008 |
| TW | 200905505 A | 2/2009 |

OTHER PUBLICATIONS

Final Office Action dated Apr. 4, 2013 for U.S. Appl. No. 12/982,721.
Non-Final Office Action dated Sep. 21, 2012 for U.S. Appl. No. 12/982,721.
Notice of Allowance dated Oct. 30, 2013 for U.S. Appl. No. 12/982,721.
Final Office Action dated Dec. 17, 2013 for U.S. Appl. No. 12/982,762.
Non-Final Office Action dated Jun. 24, 2013 for U.S. Appl. No. 12/982,762.
Non-Final Office Action dated Aug. 20, 2013 for U.S. Appl. No. 13/189,274.
Non-Final Office Action dated Sep. 14, 2012 for U.S. Appl. No. 13/189,274.
Notice of Allowance dated Dec. 4, 2013 for U.S. Appl. No. 13/189,274.
Notice of Allowance dated Jan. 7, 2013 for U.S. Appl. No. 13/189,274.

(56) References Cited

OTHER PUBLICATIONS

Non-Final Office Action dated Jun. 12, 2012 for U.S. Appl. No. 12/982,628.
Notice of Allowance dated Nov. 14, 2012 for U.S. Appl. No. 12/982,628.
Notice of Allowance dated Oct. 21, 2013 for U.S. Appl. No. 12/982,822.
Final Office Action dated Feb. 19, 2013 for U.S. Appl. No. 12/982,732.
Non-Final Office Action dated Aug. 6, 2013 for U.S. Appl. No. 12/982,732.
Non-Final Office Action dated Oct. 3, 2012 for U.S. Appl. No. 12/982,732.
Notice of Allowance dated Dec. 9, 2013 for U.S. Appl. No. 12/982,732.
Final Office Action dated Nov. 13, 2012 for U.S. Appl. No. 12/982,822.
International Search Report and Written Opinion dated Dec. 7, 2011 for PCT App. No. PCT/US11/45091.
International Search Report and Written Opinion dated Dec. 9, 2011 for PCT App. No. PCT/US11/45104.
International Search Report and Written Opinion dated Sep. 16, 2011 for PCT App. No. PCT/US11/45110.
International Search Report and Written Opinion dated Sep. 16, 2011 for PCT App. No. PCT/US11/45119.
International Search Report and Written Opinion dated Sep. 22, 2011 for PCT App. No. PCT/US11/45123.
International Search Report and Written Opinion dated Sep. 22, 2011 for PCT App. No. PCT/US11/45126.
Non-Final Office Action dated Jun. 15, 2012 for U.S. Appl. No. 12/982,822.
T. Quarles, "SPICE3 Version 3f3 User's Manual", May 1993.
Chow, Karen et al. "Method for Maintaining Electromigration in SOC's When Designing for Both Reliability and Manufacturing",2006, IEEE.
Final Office Action dated Feb. 11, 2015 for U.S. Appl. No. 12/982,762.
Non-Final Office Action dated Jul. 24, 2014 for U.S. Appl. No. 12/982,762.
Notice of Allowance dated Mar. 6, 2014 for U.S. Appl. No. 12/982,822.
Final Office Action dated May 2, 2013 for U.S. Appl. No. 12/982,790.
Non-Final Office Action dated Jan. 18, 2013 for U.S. Appl. No. 12/982,790.
Notice of Allowance dated Nov. 12, 2013 for U.S. Appl. No. 12/982,790.
Non-Final Office Action dated Sep. 3, 2015 for U.S. Appl. No. 12/982,762.
Foreign Office Action dated Jul. 21, 2015 for Taiwanese Appln. No. 100126108.
Notice of Allowance dated Jul. 31, 2015 for Taiwanese Application No. 100126053.
Office Action dated Aug. 14, 2015 for Taiwanese Appln. No. 100126109.

* cited by examiner

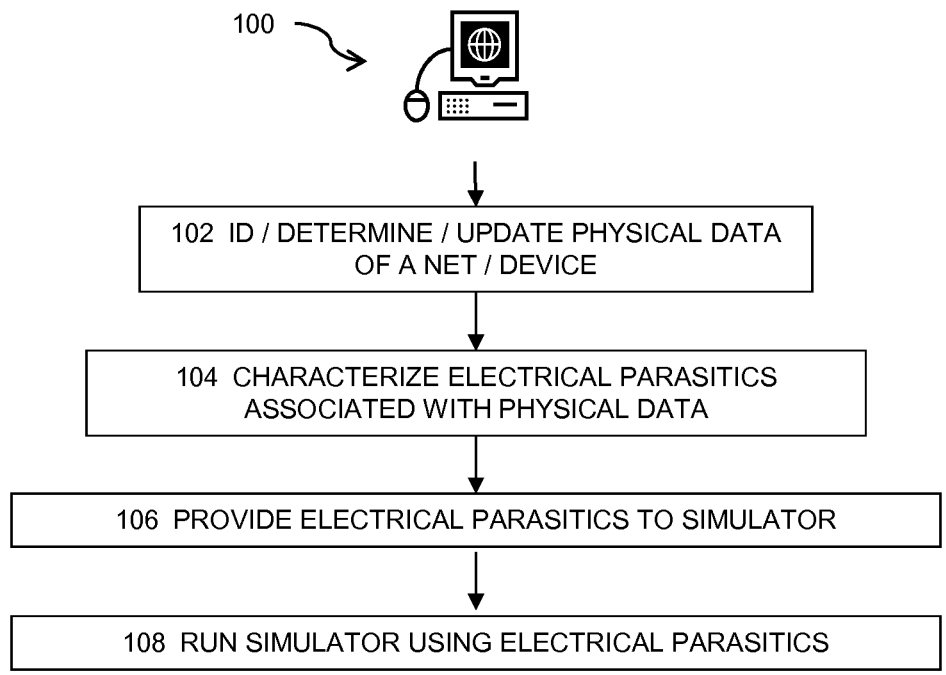
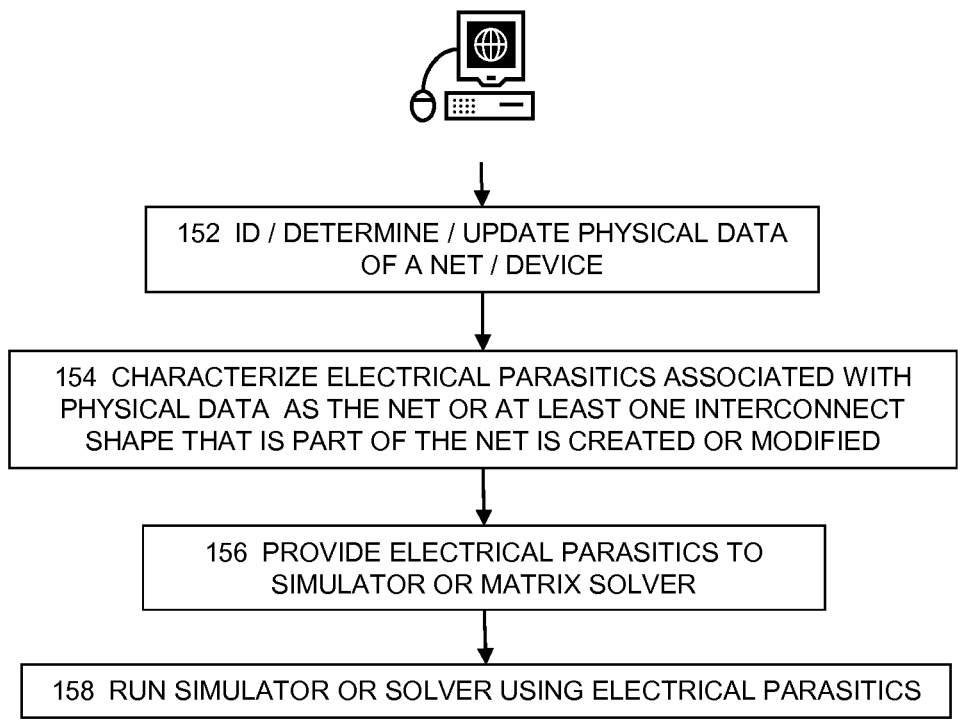

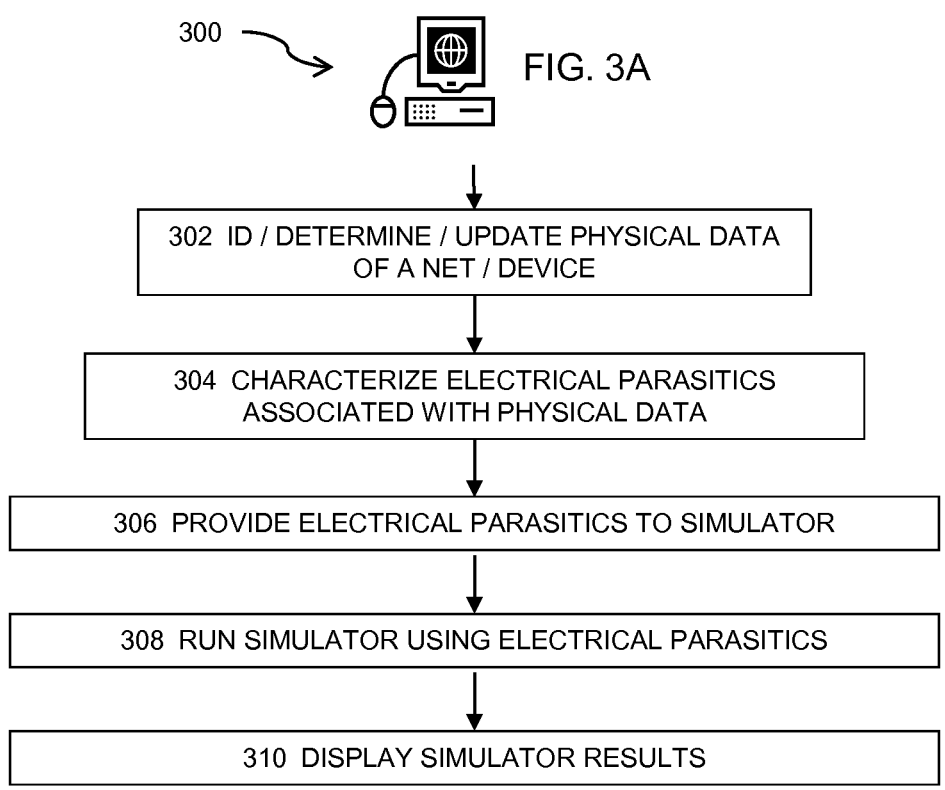

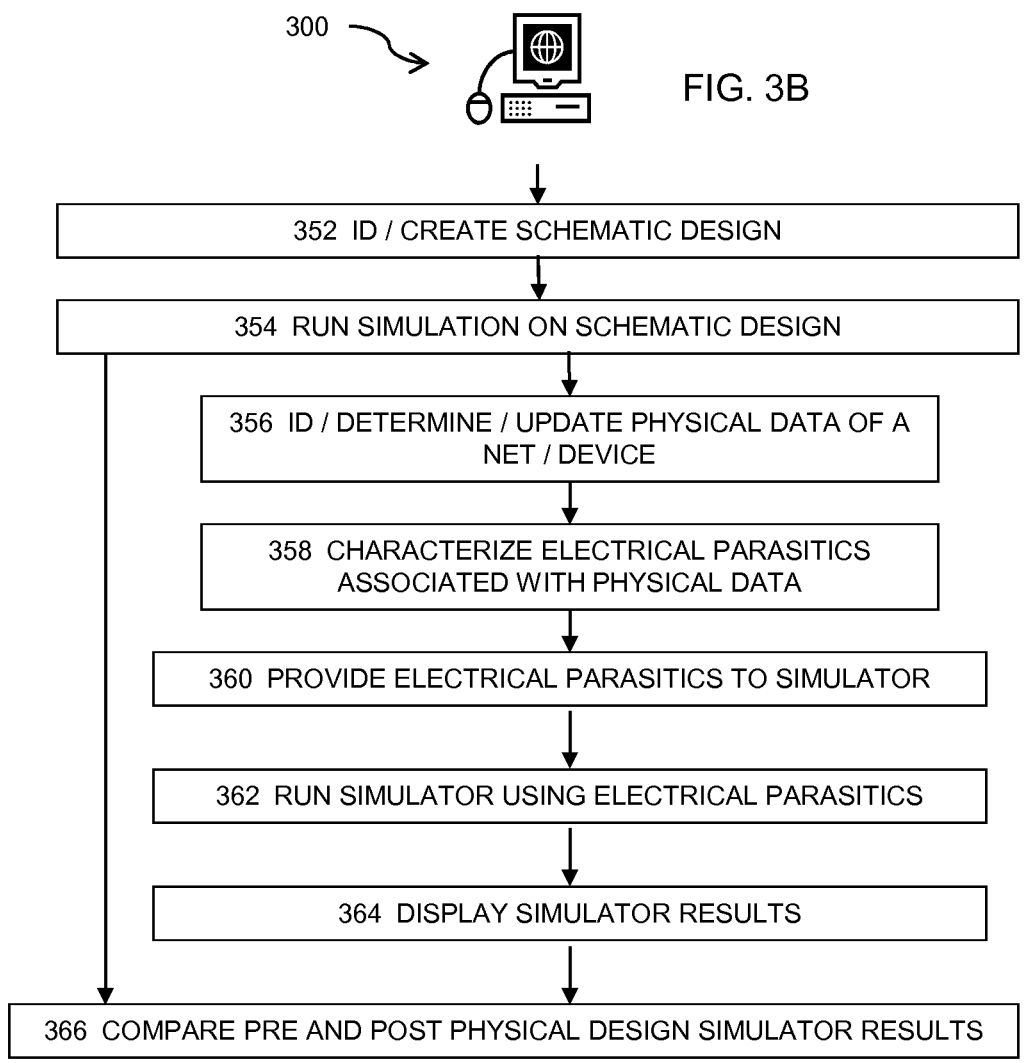

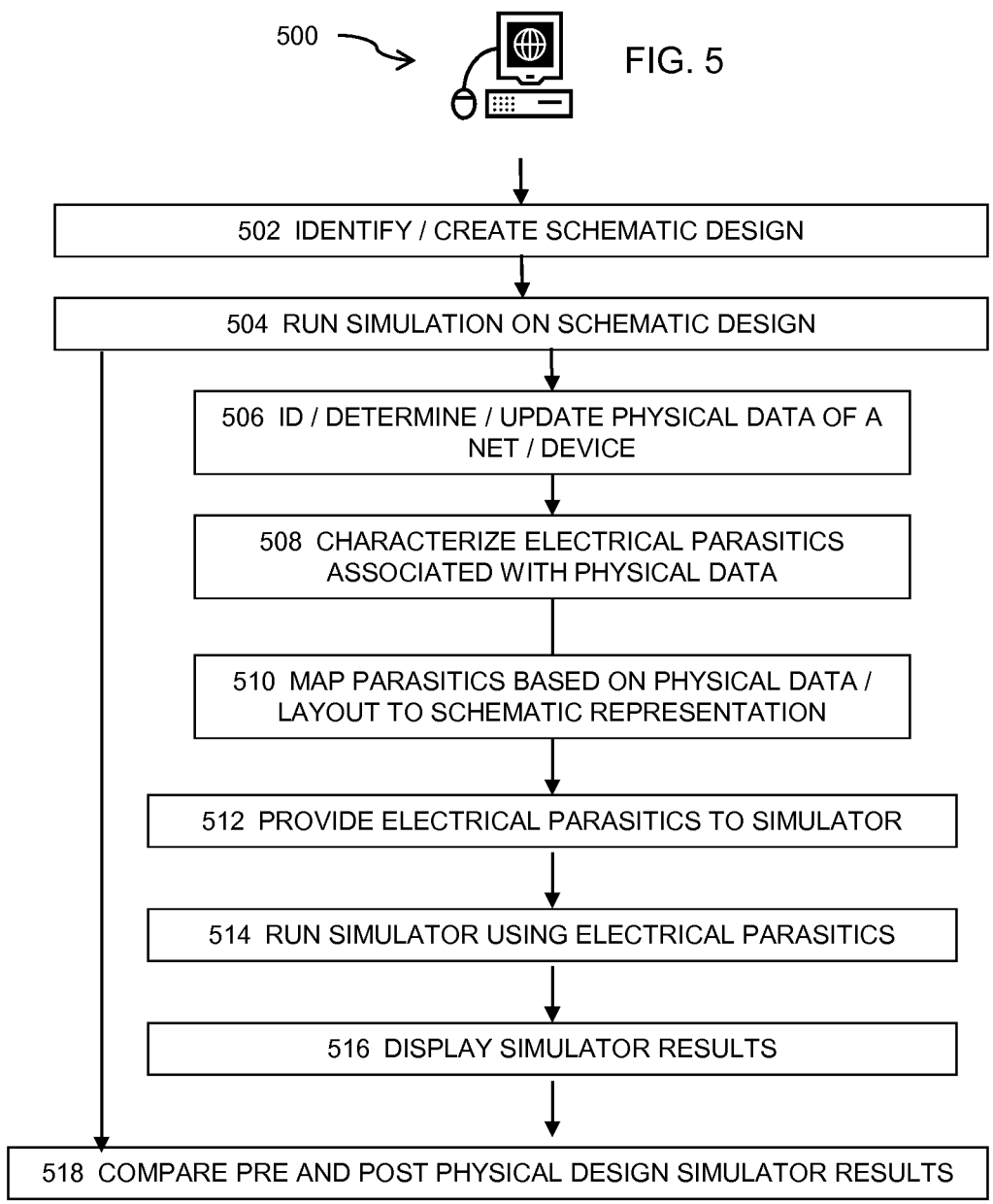

METHODS, SYSTEMS, AND ARTICLES OF MANUFACTURE FOR IMPLEMENTING ELECTRONIC CIRCUIT DESIGNS WITH SIMULATION AWARENESS

CROSS-REFERENCE TO RELATED APPLICATION(S)

This application is a divisional application of U.S. patent application Ser. No. 12/982,790, filed on Dec. 30, 2010 and entitled "METHODS, SYSTEMS, AND ARTICLES OF MANUFACTURE FOR IMPLEMENTING ELECTRONIC CIRCUIT DESIGNS WITH SIMULATION AWARENESS", which claims the benefit of U.S. Provisional App. Ser. No. 61/367,398, filed on Jul. 24, 2010 and entitled "METHODS, SYSTEMS, AND ARTICLES OF MANUFACTURE FOR CONSTRAINT VERIFICATION FOR IMPLEMENTING ELECTRONIC CIRCUIT DESIGNS WITH ELECTRICAL AWARENESS", U.S. Provisional App. Ser. No. 61/367,412, filed on Jul. 24, 2010 and entitled "METHODS, SYSTEMS, AND ARTICLES OF MANUFACTURE FOR IMPLEMENTING ELECTRONIC CIRCUIT DESIGNS WITH ELECTRICAL AWARENESS", U.S. Provisional App. Ser. No. 61/367,404, filed on Jul. 24, 2010 and entitled "METHODS, SYSTEMS, AND ARTICLES OF MANUFACTURES FOR IMPLEMENTING ELECTRONIC CIRCUIT DESIGNS WITH ELECTRO-MIGRATION AWARENESS", U.S. Provisional App. Ser. No. 61/367,406, filed on Jul. 24, 2010 and entitled "METHODS, SYSTEMS, AND ARTICLES OF MANUFACTURES FOR IMPLEMENTING ELECTRONIC CIRCUIT DESIGNS WITH IR-DROP AWARENESS", U.S. Provisional App. Ser. No. 61/367,407, filed on Jul. 24, 2010 and entitled "METHODS, SYSTEMS, AND ARTICLES OF MANUFACTURES FOR IMPLEMENTING ELECTRONIC CIRCUIT DESIGNS WITH SIMULATION AWARENESS", U.S. Provisional App. Ser. No. 61/367,410, filed on Jul. 24, 2010 and entitled "METHOD, APPARATUS, AND ARTICLE OF MANUFACTURE FOR PROVIDING IN SITU, CUSTOMIZABLE INFORMATION IN DESIGNING ELECTRONIC CIRCUITS WITH ELECTRICAL AWARENESS". The entire contents of the aforementioned U.S. patent application and U.S. provisional patent applications are hereby expressly incorporated by reference in their entirety.

This application is related to U.S. patent application Ser. No. 12/982,721, entitled "METHODS, SYSTEMS, AND ARTICLES OF MANUFACTURE FOR IMPLEMENTING ELECTRONIC CIRCUIT DESIGNS WITH ELECTRICAL AWARENESS" and filed on Dec. 30, 2012, U.S. patent application Ser. No. 12/982,762, entitled "METHODS, SYSTEMS, AND ARTICLES OF MANUFACTURE FOR IMPLEMENTING ELECTRONIC CIRCUIT DESIGNS WITH ELECTRO-MIGRATION AWARENESS" and filed on Dec. 30, 2012, U.S. patent application Ser. No. 12/982,628, entitled "METHOD, APPARATUS, AND ARTICLE OF MANUFACTURE FOR PROVIDING IN SITU, CUSTOMIZABLE INFORMATION IN DESIGNING ELECTRONIC CIRCUITS WITH ELECTRICAL AWARENESS" and filed on Dec. 30, 2012, and U.S. patent application Ser. No. 12/982,732, entitled "METHODS, SYSTEMS, AND ARTICLES OF MANUFACTURE FOR CONSTRAINT VERIFICATION FOR IMPLEMENTING ELECTRONIC CIRCUIT DESIGNS WITH ELECTRICAL AWARENESS" and filed on Dec. 30, 2012. The entire disclosures of the above applications are hereby expressly incorporated by reference in their entireties in the instant Application.

BACKGROUND

The recent advances in very deep sub-micron (VDSM) integrated circuits (ICs) have brought new challenges in the physical design methodology process of integrated systems. In modern electronic circuits, geometries become smaller; clock frequencies increase; and on-chip interconnections gain increased importance in the prediction of performance.

Conventional electronic circuit design tools focus on post-layout verification of the layout when the physical design of the entire chip design is complete and detailed information about the parasitics of the physical designs and the currents drawn by the transistors are known. In other words, conventional circuit synthesis step is followed by layout synthesis and each step is carried out independent of the other. This is again followed by a physical or formal verification step to check whether the desired performance goals have been achieved after layout generation and extraction. These steps are carried out iteratively in such conventional approaches till the desired performance goals are met. These conventional approaches basically perform post-layout verification on the complete layout, identify the problems, modify the layout, perform simulation(s) again with the modifications to ensure various goals are met, and re-perform the post-layout verification again to see, for example, if all design rules are fulfilled. Nonetheless, such conventional approaches waste a lot of computing resources in this iterative approach.

Therefore, what is needed is a method, a system, and a computer program product for implementing incremental extraction based simulation for electronic circuit designs.

SUMMARY

In various embodiments, the process begins with the creation of a schematic that describes the design. The schematic may include one or more schematic circuit elements, various parameters on these schematic elements and a description of the connectivity between these schematic elements. The schematic of the circuit is then used to generate a netlist, which is typically a textual representation of the schematic elements, the parameters on those elements & the connectivity between those elements. This netlist is passed on to a circuit simulator to simulate the circuit. The results of the simulation are used by the designer to analyze the functional behavior of the circuit and ensure that the circuit meets the required design specifications.

As part of the design process, a physical design corresponding to the circuit is created or modified by the layout designer. The electrical parasitics, such as the resistances and capacitances of the interconnect wires, are extracted from the physical design. The impact of physical design decisions such as geometric dimensions and placement of devices and interconnect or the creation of multiple devices in layout from one device in the schematic, e.g. fingers, m-factors, is not known until the verification process is done. Once a custom physical design is complete to the point that LVS and DRC is performed and passed during the verification stage, parasitic extraction and simulation may be performed. This method allows the designer to simulate the impact of physical design beginning with the first net and may be used with partial layout(s) in some embodiments.

Various embodiments will be described for more efficiently transferring physical design data such as electrical parasitics to the simulator. Some embodiments will use the existing custom design flow. Some of the embodiments describe new systems and methods or process flows to reduce the amount of parasitic data and the amount of redundant design data when only one or more nets or devices are created or modified. The reduction of data allows for a faster flow from parasitic extraction to generation of simulation results in that less redundant data is transferred, mapped through the binder or stored/computed within the simulator.

A simple example is a long two terminal wire that has several jogs and may span several metal levels. The parasitic description of this wire may have 100 resistors in series that can simply be summed and effectively represented by a smaller or reduced set, e.g. one effective resistance. The parasitic description may have 100 coupling capacitances that can be lumped to ground effectively producing a smaller or reduced set. Another example is where a designer knows that some set Q nets of a total of P nets will dictate some performance aspect of the device. This approach allows the designer to use a more comprehensive set of parasitics for the Q nets and to significantly reduce the parasitics for the other P-Q nets.

BRIEF DESCRIPTION OF THE DRAWINGS

The drawings illustrate the design and utility of various embodiments of the present invention. It should be noted that the figures are not drawn to scale and that elements of similar structures or functions are represented by like reference numerals throughout the figures. In order to better appreciate how to obtain the above-recited and other advantages and objects of various embodiments of the invention, a more detailed description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which:

FIGS. 1A-B illustrate top level block diagrams for implementing various embodiments of the methods or systems for implementing electronic circuit design with simulation awareness.

FIGS. 3A-B illustrate more details for the method or system for implementing various embodiments of the methods or systems for implementing electronic circuit design with simulation awareness.

FIG. 5 illustrates a more detailed block diagram for implementing various embodiments of the methods or systems for implementing electronic circuit design with simulation awareness.

DETAIL DESCRIPTION

Figure 2A:
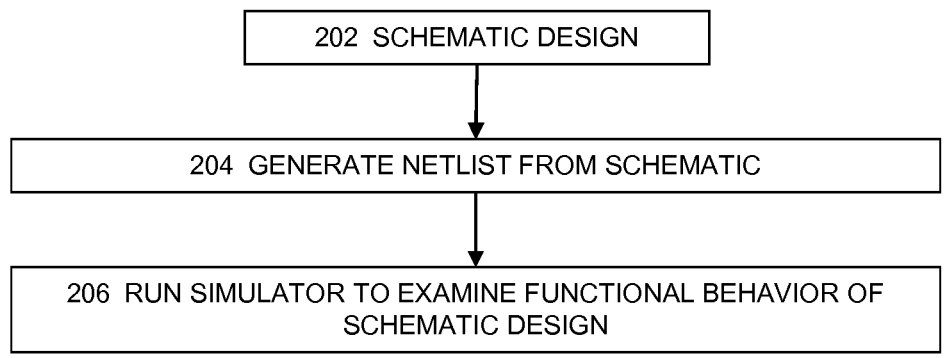
FIGS. 2A-C illustrate more detailed block diagrams for the method or system for implementing various embodiments of the methods or systems for implementing electronic circuit design with simulation awareness.

Various embodiments of the invention are directed to a method, system, and computer program product for implementing electronic circuit designs with simulation awareness in a single embodiment or in some embodiments. Other objects, features, and advantages of the invention are described in the detailed description, figures, and claims.

Various embodiments will now be described in detail with reference to the drawings, which are provided as illustrative examples of the invention so as to enable those skilled in the art to practice the invention. Notably, the figures and the examples below are not meant to limit the scope of the present invention. Where certain elements of the present invention can be partially or fully implemented using known components (or methods or processes), only those portions of such known components (or methods or processes) that are necessary for an understanding of the present invention will be described, and the detailed descriptions of other portions of such known components (or methods or processes) will be omitted so as not to obscure the invention. Further, the present invention encompasses present and future known equivalents to the components referred to herein by way of illustration.

Referring to FIG. 1A which illustrates a top level diagram for implementing various embodiments of the methods or systems for implementing electronic circuit designs with simulation awareness, the method or system for implementing electronic circuit designs with simulation awareness comprises the process or module for identifying, determining, or updating physical data of a net, a device, or a component (hereinafter "a component" collectively) of an electronic circuit physical design (102) on a computing node, a terminal, or a server (100) having a user interface (hereinafter a computing node) in various embodiments.

In these embodiments, the method or the system needs only a partial layout that comprises merely one component, such as an interconnect wire segment, a via, or a via cluster, to perform its intended functions of implementing electronic circuit design with simulation awareness. In other words, some embodiments as described herein do not require a complete physical layout that have gone through the complete placement, global routing, and detail routing stages. That is, the method and system provide the designers with the ability to implement the electronic circuit design with simulation awareness from the first component, the first device, or the first net in the physical design without going through costly iterations between the physical design and the post-layout verification design flows. For example, even if a physical design contains only one segment of an interconnect, and the remainder of the physical design has not been completed yet, the method or the system may still determine whether this particular interconnect segment meets one or more simulation related constraints or performance expectations and whether and what kind of adjustments need to be made to the design to ensure the compliance of the one or more simulation related constraints or performance expectations. In some embodiments, an adjustment comprises creation of a new route or a segment thereof or modification of an existing route or a segment thereof. In some embodiments, an adjustment comprises placement of a component in a physical design of an electronic circuit design.

In some embodiments, the physical data may be related to a net, which comprises one or more wires or interconnects connecting various other components together in an electronic circuit design. In some embodiment, the physical data may be related to a single component in the physical design (e.g., a layout) of the electronic circuit. For example, the method or the system may be applied to determine whether an interconnect segment complies with one or more simulation related constraints or performance expectations. In this example, the physical data may comprise, for example, the width, the length, the cross-sectional area along the segment, overlap of a metal object and via object, etc. In some embodiments, the physical data may be related to a device, which comprise a physical layers of materials with specific geometric dimensions comprise a source, gate and a drain. A device may be, for example, a field-effect transistor. In this example, the physical data may comprise the description of physical device layers and geometric descriptions that define the gate, source and drain regions. The physical data may also include the placement of electrical contacts to connect the device to interconnect wiring. In various embodiments, the physical data may further comprise the material and its associated physical (e.g., physical or electrical) attributes.

For example, the physical data for a wire segment may comprise the material (e.g., Copper, Aluminum, Tungsten, etc.), one or more physical attributes, such as the electrical resistivity.

In some embodiments, the process for identifying, determining, or updating physical data of a net, a device, or a component of an electronic circuit physical design are invoked from within a physical design tool or flow, such as a layout editor, while the designer is implementing or modifying the physical design of the electronic circuit rather than from a post-layout verification tool or flow.

In some embodiments, the drawn geometries of the physical design objects may be combined with manufacturing models to estimate manufactured geometries for those objects or statistical distributions associated with the object. In this approach the as-manufactured geometries can be used with the parasitic models to provide a more accurate estimate of the electrical parasitics, R, L or C.

In a single embodiment or in some embodiments, the method or system for implementing electronic circuit designs with simulation related constraints or performance expectations comprises the process or module for identifying, determining, or characterizing an electrical parasitic that is associated with the component in the physical design at 104. In some embodiments, the method or the system may also comprise the process or module for identifying, determining, or characterizing a device parameter that is associated with the component in the physical design at 104. In some embodiments, the method or the system may also comprise the process or module for identifying, determining, or characterizing an electrical parasitic or a device parameter that is associated with the component in the physical design at 104. In these embodiments, the electrical parasitic and the device parameter are collectively referred to as "electrical parasitic" or simply "parasitic".

In some embodiments, the one or more electrical parasitics comprise resistance, self- or coupled-inductance, or capacitance that is associated with the physical data. In the previous example of an interconnect segment in a physical design, the method or the system may characterize the resistance of this particular interconnect segment by using the electrical resistivity, the length of the segment, and the cross-sectional area along the segment. In some embodiments the system monitors and tracks the relevant physical data associated with the creation or change to the design, for example the creation of a net or the widening of a wire segment in a net. Resistance and capacitance models can be applied automatically to compute the parasitic data. Thus, parasitics may be generated interactively as physical design objects are created or modified. The set of partial design objects, including a set of one or more objects that is interactively analyzed may form a partial layout. The data is stored for use with subsequent electrical analysis steps and may additionally be displayed in parasitic form.

In a single embodiment or in some embodiments, the method or system for implementing electronic circuit designs with simulation related constraints or performance expectations comprises the process or module for characterizing one or more electrical parasitics that are associated with the physical data and the process or module of characterizing one or more electrical characteristics associated with the one or more electrical parasitics and physical data.

In a single embodiment or in some embodiments, the electrical parasitic data associated with the physical data is provided to a simulator for static or transient analysis at 106. The simulator is run (108) to produce voltage or current data for device and interconnect components of the design. The results stored, displayed or compared against a previous simulation run.

In a single embodiment or in some embodiments, the electrical parasitic data associated with the physical data is provided to a matrix solver for static or transient analysis. The matrix solver is run. In a single embodiment or in some embodiments, the method or system for implementing electronic circuit designs with simulation related constraints or performance expectations comprises a flow where the simulator or solver is invoked after a single net has been created or modified.

FIG. 1B illustrates a top level diagram for implementing various embodiments of the methods or systems for implementing electronic circuit designs with simulation awareness in some embodiments. In some embodiments that encompass the process flow illustrated in FIG. 1B, the method or system may comprise the process or module of the process or module for identifying, determining, or updating physical data of a component of an electronic circuit physical design (152) on a computing node. In these embodiments, the method or the system may also comprise the process or module for characterizing one or more electrical parasitics that are associated with the physical data as the component or at least one interconnect shape that is a part of the component is being created or modified at 154.

The method or the system may comprise providing the one or more electrical parasitics to one or more simulators, one or more matrix solvers, or a combination of simulator(s) and matrix solver(s) at 156 in one or more embodiments. The method or the system may then invoke the one or more simulators, the one or more matrix solvers, or a combination of simulator(s) and matrix solver(s) to generate various voltage or current data for device and interconnect components of at least a portion of the electronic circuit design. In some embodiments, the portion of the electronic circuit design comprise only a partial physical design of the electronic circuit design, and the partial physical design does not and will not pass a layout versus schematic (LVS) check or verification due to the lack of one or more components in the partial physical design.

Some embodiments (FIGS. 2A, 2B, 2C) may use netlists generated from either the schematic design or the implemented physical design. A process flow from schematic design to simulation is shown In FIG. 2A. A schematic is created that may include one or more schematic circuit elements, various parameters on these schematic elements and a description of the connectivity between these schematic elements (202). The schematic of the circuit is then used to generate a netlist (204), which is typically a textual representation of the schematic elements, the parameters on those elements and the connectivity between those elements. The netlist is passed on to a circuit simulator to simulate the circuit (206). The results of the simulation are used by the designer to analyze the functional behavior of the circuit and ensure that the circuit meets the required design specifications.

Figure 2B:
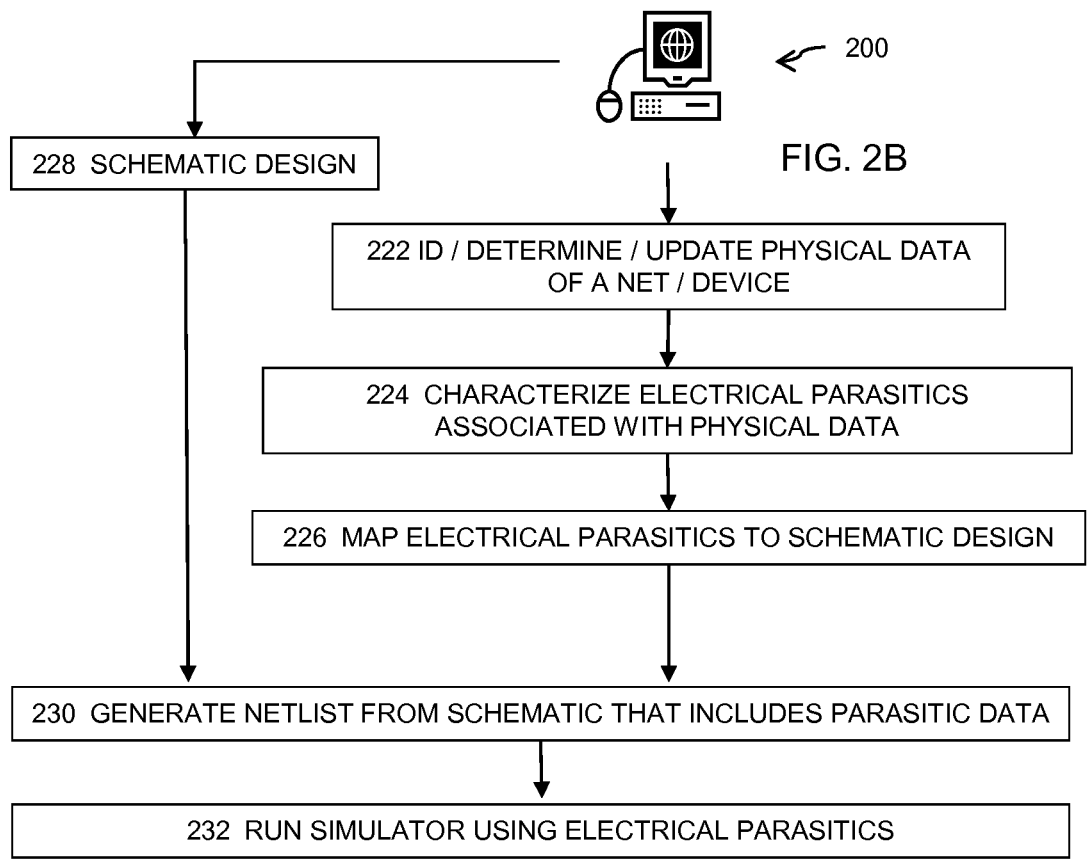

The parasitic aware simulation flow from schematic design is illustrated in FIG. 2B in some embodiments. A schematic is created that may include one or more schematic circuit elements (228) via, for example, a computing node, a terminal, or a server (200) having a user interface in various embodiments. Various parameters on these schematic elements and a description of the connectivity between these schematic elements. The schematic of the circuit is then used to generate a netlist, which is typically a textual representation of the schematic elements, the parameters on those elements and the connectivity between those elements (230). A physical design object, e.g. wire, via or via cluster, or set of objects, are created or modified (222 or 242). In some cases the physical design may be loaded into a design tool and connectivity and device recognition software is ran to better characterize the electrical nature of the design in some embodiments (224 or 244).

In some embodiments the characterization of electrical parasitics associated with physical data may be done with a two stage approach. This process begins with the selection a particular net or partial net. In the first stage, the process identifies where along that net that a geometric description should be created. The geometric descriptions may include wire widths and spacings, conductor and ILD (inter-layer dielectrics) thicknesses, or thickness of barrier materials. A common description may be created and provided via an API (application programming interface.)

The second stage may include one or more components that may translate, convert, transform, or map (hereinafter "map") the geometric description to an equivalent parasitic value such as a resistance, capacitance or inductance. This translation, conversion, transformation, or mapping (hereinafter "mapping") may be done with mathematical algorithm(s) or model(s) that is (are) often referred to as parasitic extraction. The model(s) may be created through the use of semi-empirical methods that combine models or knowledge of the underlying physics with data provided by a solver such as but not limited to an EM (electro-migration) solver. In some cases, the mapping for capacitance may also be done with a solver such as but not limited to an EM solver.

In some embodiments the second stage may use parasitic extraction for some nets and a field solver for other nets. In some embodiments, the second stage may use a combination of parasitic extraction for resistance(s) and a field solver for capacitance(s) on the same net. In some embodiments, the characterization of electrical parasitics is conducted with extraction tools that map geometric dimensions and patterns to corresponding parasitics such as, but not limited to, R, L, or C. In some embodiments, the characterization of electrical parasitics includes the use of field solvers (such as but not limited to one or more EM field solvers) that map geometric dimensions and patterns to capacitance(s).

The electrical parasitics associated with the some percentage (e.g. one or more nets) of the physical design are mapped to the schematic design in some embodiments (226). In order to evaluate the impact of these parasitics on the functional behavior of the circuit, these parasitics need to be mapped and stitched to a flattened representation of the schematic. The flattening of the schematic hierarchy enables the capturing of unique representations of circuit elements in cases where multiple instances of the same circuit element exists within the hierarchy in some embodiments. The flattening process mimics an elaboration of the schematic that is performed by the simulator in the original simulation of the schematic without parasitics as described above.

In some embodiments, the components used in the physical design to implement the devices in the layout may not necessarily have the same names as the ones used on the schematic. They may have different names for the terminals and nets representing their connectivity on the layout. There might further be several components on the layout corresponding to the same circuit element on the schematic; for example, m-factor parameters on schematic devices can cause a 1-to-M mapping between circuit elements instances on the schematic and physical component instances on the layout. Further, the design hierarchy might differ between the schematic and the layout. For example, there could be multiple levels of schematic hierarchy corresponding to a single level of layout hierarchy. There may be several levels of layout hierarchy as well in some embodiments.

The connection nodes of the parasitics on the layout therefore need to be correctly mapped to their schematic counterparts in order to be able to correctly stitch these parasitics into the schematic domain in some embodiments. In these embodiments, the hierarchical schematic/layout binding step in the process performs such a mapping of devices from the layout hierarchy to the schematic hierarchy while taking into account the various mappings between the schematic and layout devices, including differences in names of devices and/or nets, differences in names of terminals and 1-to-M mappings between schematic & layout devices.

Once the parasitic node names are mapped to the schematic nodes names, the stitching process inserts parasitic schematic components on the flattened schematic. This process removes original wired connections for each of the nets on the schematic with their corresponding parasitic network elements in some embodiments.

In some embodiments, the layout is not fully complete. The partial layout may only contain layout components corresponding to certain critical devices in the layout. The layout may further only contain routing information for certain critical nets. In such cases, only the parasitic elements corresponding to elements in the parasitic layout are mapped back to the schematic. Only those elements are stitched in to the flattened schematic.

The resulting flattened schematic with parasitic elements is used to create a netlist (230) for simulation purposes (232 or 248) in some embodiments. In these embodiments, the netlist contains the circuit description with devices from the original schematic representation and the additional parasitic devices corresponding to the parasitics fetched and mapped from the layout. This netlist is passed on to a circuit simulator to simulate the functional behavior of the circuit with parasitics. In some embodiments, the results of the simulation are used by the designer to analyze the functional behavior of the circuit and evaluate if the circuit meets the required design specifications in the presence of parasitics from the layout.

Figure 2C:
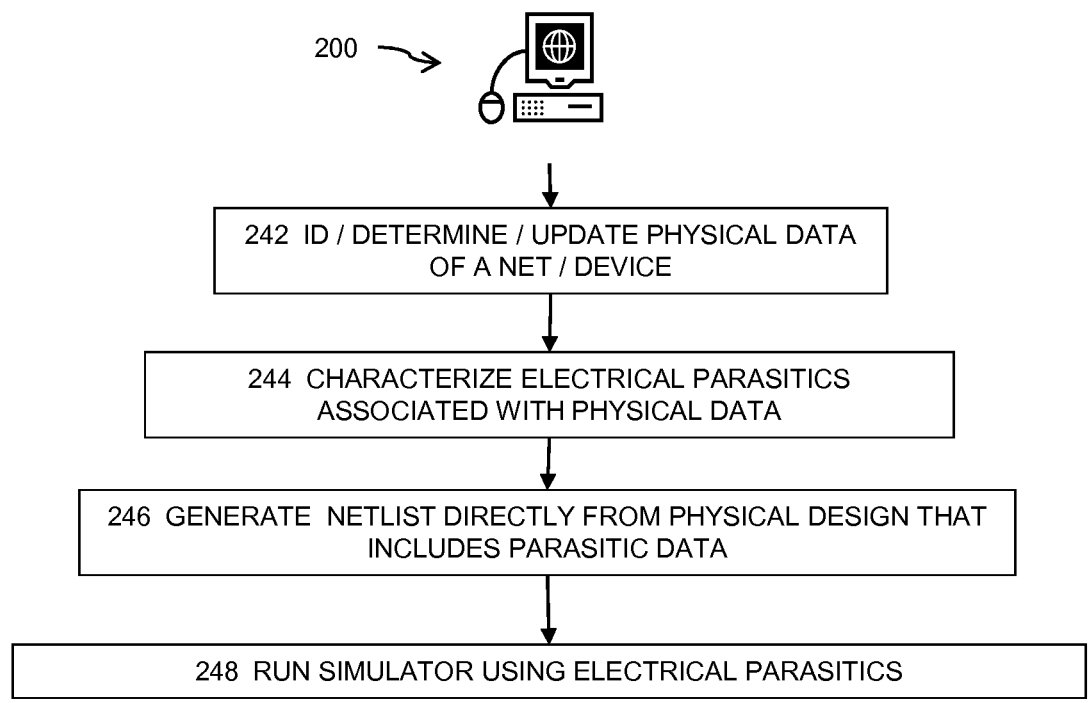

Some embodiments may generate a netlist directly from the physical design (246) as shown in FIG. 2C. In these embodiments, this approach reduces/eliminates the need to map the parasitic data back to the schematic representation. This approach may also generate significantly more data which slows the building of the netlist and completion of the simulation. As such, some embodiments may implement various methods to reduce the parasitics to speed up the simulation. In some embodiments, the results of the simulation are used by the designer to analyze the functional behavior of the circuit and evaluate if the circuit meets the required design specifications in the presence of parasitics from the layout. In some embodiments, device parameters such as parameters associated with well proximity effects, area of source and drain and perimeter.

FIGS. 3A-B illustrate a top level diagram for a method or system for implementing electronic circuit designs with simulation awareness in some embodiments. The flow of the process or the invocation of various modules is substantially similar to that as illustrated in FIG. 1. For example, the method or system for implementing electronic circuit designs with simulation awareness comprises the process or module for identifying, determining, or updating physical data of a component of an electronic circuit physical design (302) on a computing node, a terminal, or a server (300) having a user interface in various embodiments.

In a single embodiment or in some embodiments, the method or system for implementing electronic circuit designs with simulation related constraints or performance expectations comprises the process or module for characterizing one or more electrical parasitics that are associated with the physical data at 304. In some embodiments, the one or more electrical parasitics comprise resistance, self- or coupled-inductance, or capacitance that is associated with the physical data. In the previous example of an interconnect segment in a physical design, the method or the system may characterize the resistance of this particular interconnect segment by using the electrical resistivity, the length of the segment, and the cross-sectional area along the segment. In some embodiments the system monitors and tracks the relevant physical data associated with the creation or change to the design, for example the creation of a net or the widening of a wire segment in a net. Resistance and capacitance models can be applied automatically to compute the parasitic data. Thus, parasitics may be generated interactively as physical design objects are created or modified. The set of partial design objects, including a set of one or more objects that is interactively analyzed may form a partial layout. The data is stored for use with subsequent electrical analysis steps and may additionally be displayed in parasitic form.

In a single embodiment or in some embodiments, the electrical parasitic data associated with the physical data is provided to a simulator for static or transient analysis at 306. The simulator is run (308) to produce voltage and current data for device and interconnect components of the design. The results stored, displayed or compared against a previous simulation run.

The methods or systems as illustrated in FIGS. 3A-B may further comprise the process or module for displaying the simulation result(s) in a user interface on a display apparatus (310). More details about displaying various information or data in a user interface are described in U.S. application Ser. No. 12/982,628, entitled "METHOD, APPARATUS, AND ARTICLE OF MANUFACTURE FOR PROVIDING IN SITU, CUSTOMIZABLE INFORMATION IN DESIGNING ELECTRONIC CIRCUITS WITH ELECTRICAL AWARENESS" and filed on Dec. 30, 2012 with the instant Application, the contents of which are hereby incorporated by reference in their entirety.

FIG. 3B illustrates a top level diagram for a method or system for implementing electronic circuit designs with simulation awareness in some embodiments. In these embodiments, the method or the system as illustrated in FIG. 3B may comprise the process or module for identifying or creating a schematic design of an electronic circuit at 352. The method or the system may then proceed to run simulation(s) on the schematic design at 354 in one or more embodiments. Once the schematic level simulation is performed, the method or the system may proceed to the process or module for comparing the pre- and post-physical design simulator results at 366 in some embodiments. In addition or in the alternative, the method or the system may proceed to the processes or modules as illustrated in FIGS. 1 and 2C to perform the processes or to invoke the modules of 356, 358, 360, and 362, which are substantially similar to those of 242, 244, 246, and 248 of FIG. 2C or 102, 104, 106, and 108 of FIG. 1 in some embodiments and then proceed to display one or more results of running the simulator using the electrical parasitics at 364.

Some embodiments (FIG. 4A) may use a mapping to allow for electrical parasitics associated with the physical design to be usable by the simulator (406). For example, a single device in the schematic representation may be implemented as multiple devices in the physical design. In this case, the parasitics that describe each physical device will not match the schematic. Some embodiments may use the mapping to reduce the parasitics to an equivalent representation that matches the schematic. Some embodiments may use the mapping to modify the schematic to more closely resemble the physical design and stitch in the parasitic data where appropriate. The processes or modules 402, 404, 408, and 410 and the computing node 400 are substantially similar to corresponding processes or modules described with respect to FIGS. 1, 2A-C, and 3A-B and thus will not be repeated.

Figure 4A:
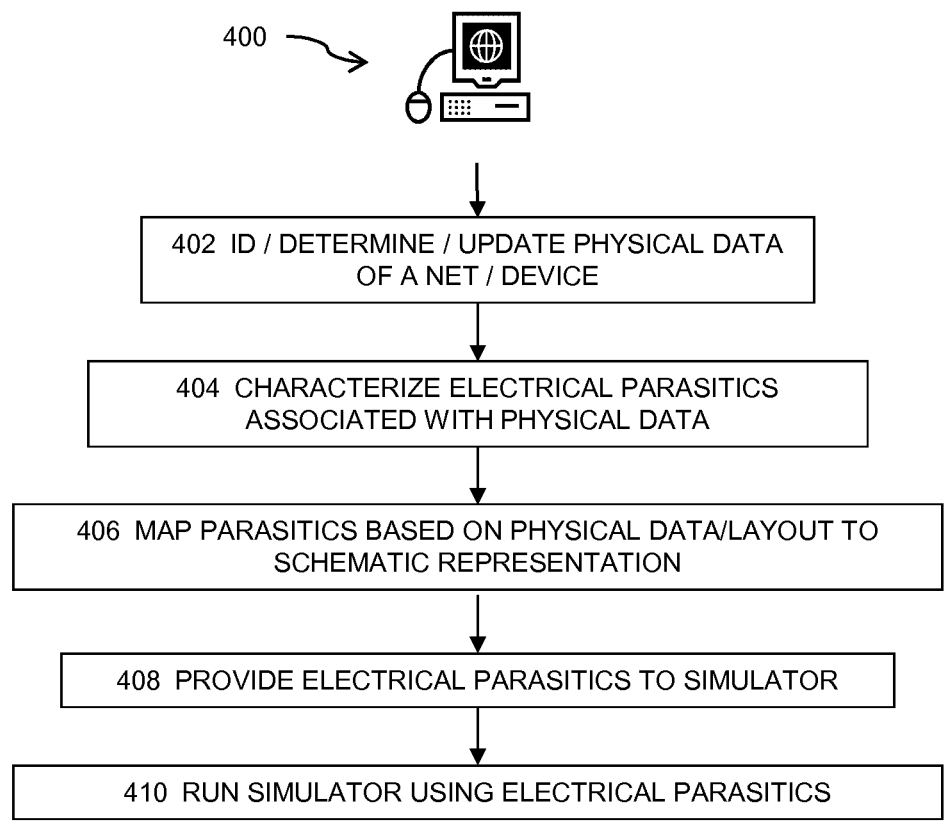
FIGS. 4A-C illustrate more details for the method or system for implementing various embodiments of the methods or systems for implementing electronic circuit design with simulation awareness.
Figure 4B:
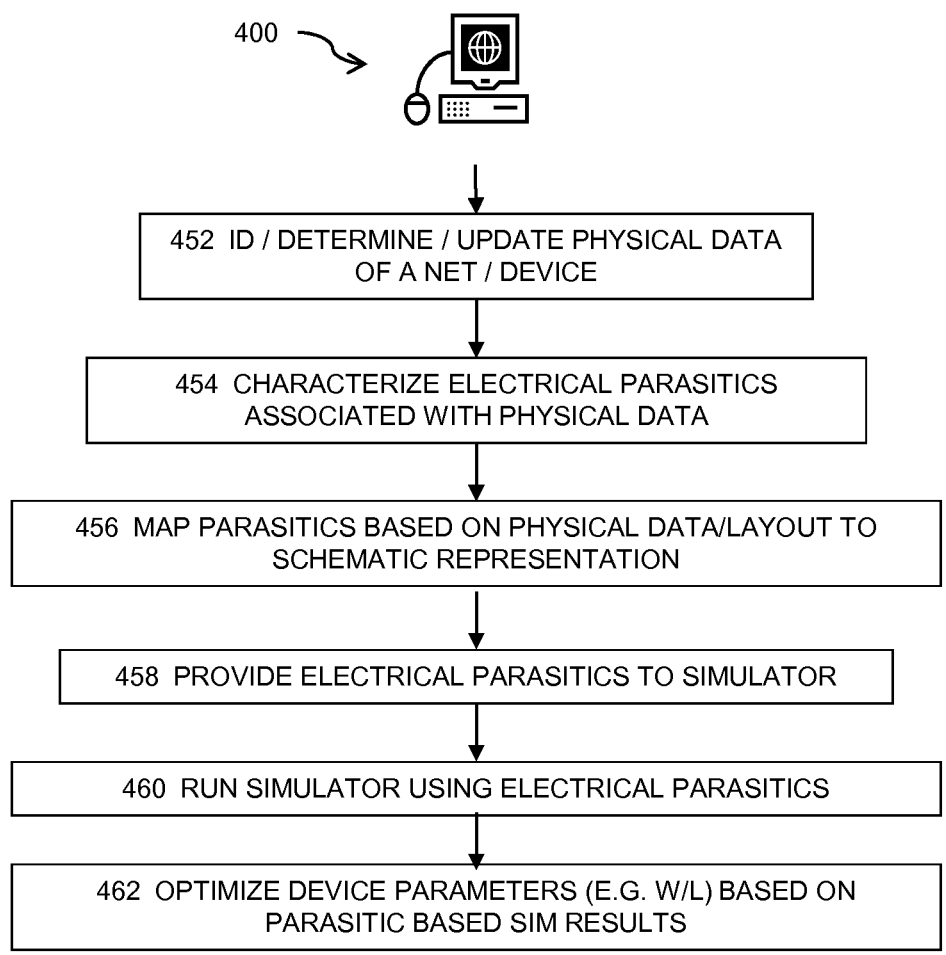

FIG. 4B illustrates a method or a system that is substantially similar to that as illustrated in FIG. 4A in some embodiments. In these embodiments, the method or the system as illustrated in FIG. 4B may further comprise the process or module for optimizing one or more device parameters based at least in part upon one or more parasitic based simulation results (462). In some embodiments, the one or more device parameters comprise, for example but not limited to, the width or the length of the device. It shall be noted that the processes or modules 452, 454, 456, 458, and 460 as well as the computing node 400 are substantially similar to the corresponding processes or modules illustrated in FIG. 4A and thus will not be repeated here.

Figure 4C:
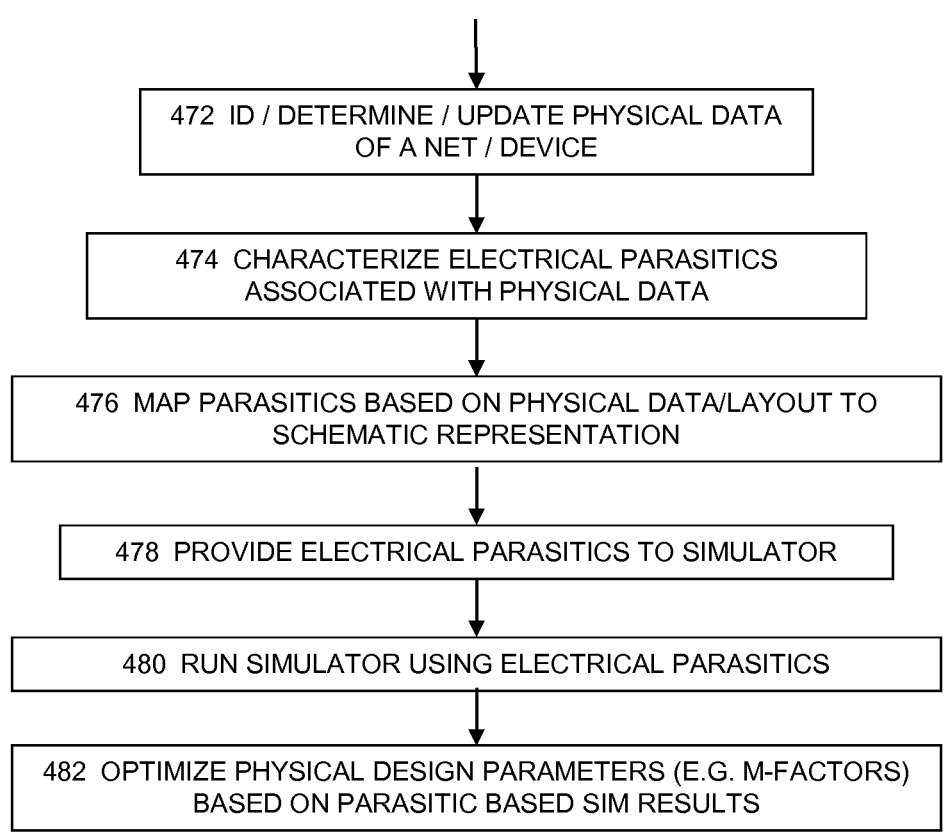

Some embodiments (FIG. 4C) may use the simulator results to optimize the design such as device W/L (width/length) parameters, contact locations/proximity to the gate, finger or m-factor implementations or interconnect location or size (480). It shall be noted that the processes or modules 472, 474, 476, 478, and 480 as well as the computing node 400 are substantially similar to the corresponding processes or modules illustrated in FIGS. 4A-B and thus will not be repeated here.

FIG. 5 illustrates a top level flow diagram for a method or system for implementing electronic circuit designs with simulation awareness in some embodiments. The flow as illustrated in FIG. 5 is substantially similar to that in FIG. 3B. In some embodiments, the method or the system as illustrated in FIG. 5 comprises the process or module of mapping the parasitics based at least in part upon the physical data or the layout to schematic data representation (510). This mapping process or module is substantially similar to that as illustrated in FIG. 2B and described in some of the preceding paragraphs and will not be repeated here. The other processes or modules 502, 504, 506, 508, 512, 514, 516, and 518 as well as the computing node 500 are also substantially similar to the corresponding processes and modules in FIGS. 1-4 and thus will not be repeated here.

Some embodiments (FIG. 6) may reduce the amount of parasitic data that is provided to simulation (608). The reduction of data allows for a faster flow from parasitic extraction to generation of simulation results in that less data is transferred, less data has to be mapped to the schematic and the simulator has to process and store less data. In some embodiments, the reduction will include the consolidation of resistor values that are in series or parallel. In some embodiments, the reduction may include the use of selected wire fracturing where the geometric wire shapes are separated and an equivalent resistance or capacitance values is determined.

A simple example is a long two terminal wire that has several jogs and may span several metal levels. The parasitic description of this wire may have 100 resistors in series that can simply be summed and effectively represented by a smaller or reduced set, e.g. one effective resistance. The parasitic description may have 100 coupling capacitances that can be lumped to ground effectively producing a smaller or reduced set. Another example is where a designer knows that some set Q nets of a total of P nets may dictate some performance aspect of the device. This approach allows the designer to use a more comprehensive set of parasitics for the Q nets and to significantly reduce the parasitics for the other P-Q nets.

Moreover, the process or module of characterizing one or more electrical characteristics associated with one or more electrical parasitics may comprise identifying or determining current such as the peak current, the maximum sustained current, the average current, or the RMS current by performing simulation(s) for each terminal of a component, device, or net. In addition or in the alternative, the current waveforms, duty cycle(s), frequency(ies), or pulse widths may also be considered in some embodiments. In some embodiments, the RMS currents may be used with analog designs or reliability critical applications where self-healing effect need not be considered. In some embodiments, the average currents may be used in, for example, some digital signal nets where self-healing effects need to be considered.

The process or module for characterizing one or more electrical parasitics (604) may further comprise using a linear solver to determine the current(s) or voltage(s) of a net, device, or component in some embodiments. For example, the process or module for characterizing one or more electrical parasitics may identify the current(s) from the schematic enabled simulation(s) and then invoke a linear matrix solver to solve for the current flows through the net in the physical design by using the conductance. It shall be noted that the method or the system may invoke one or more different solvers, such as a non-linear solver, a commercial circuit simulation tool, or a combination thereof (hereinafter solver), etc. to achieve substantially the same purpose.

Figure 6:
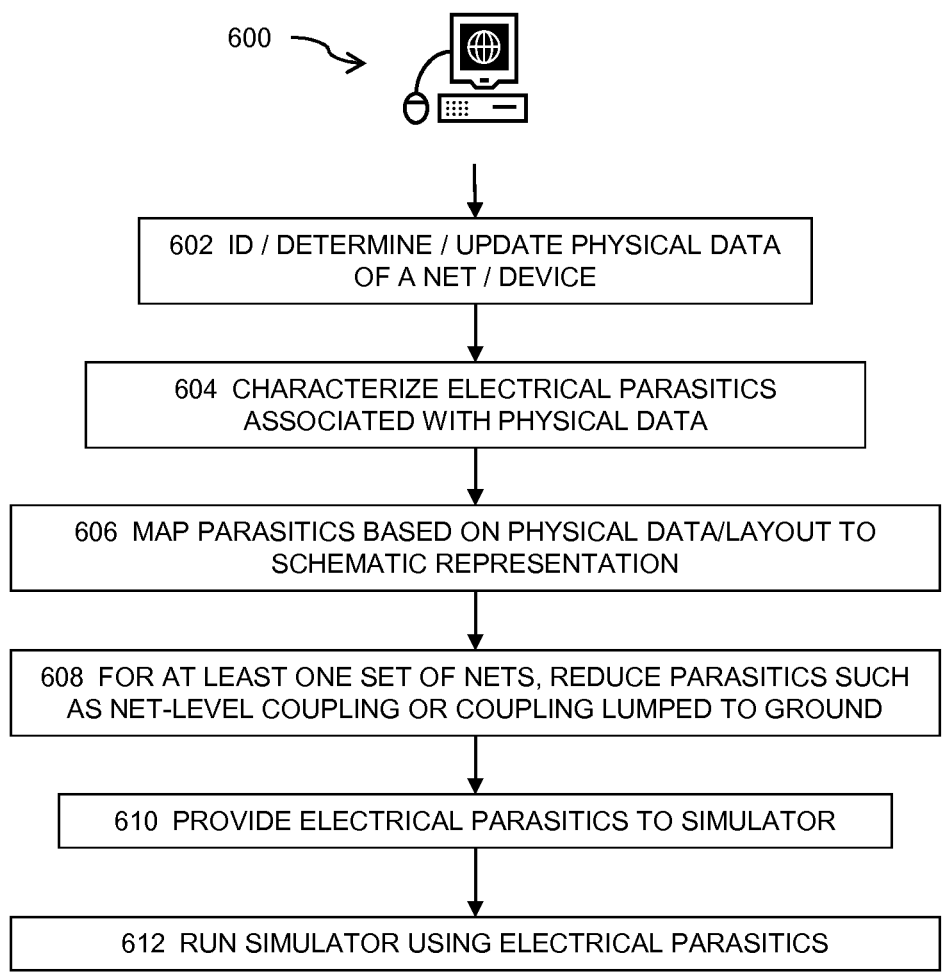
FIG. 6 illustrates a more detailed block diagram for implementing various embodiments of the methods or systems for implementing electronic circuit design with simulation awareness.
Figure 7:
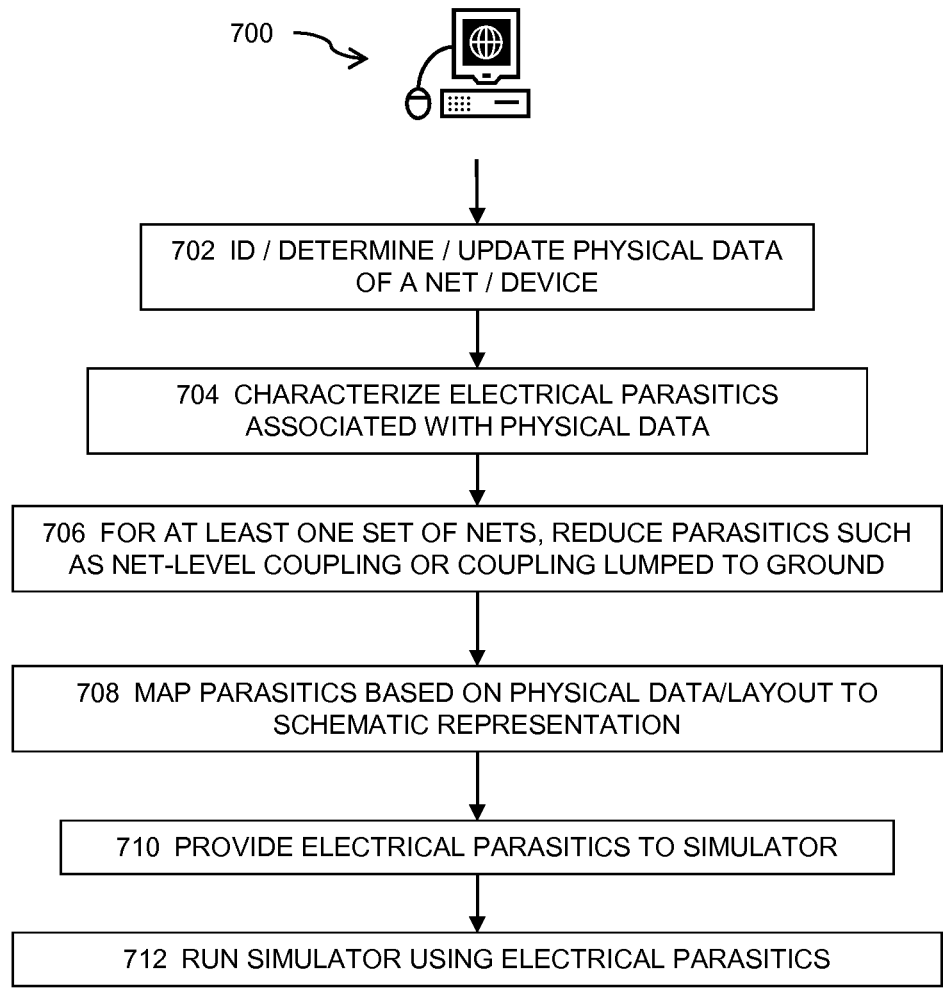
FIG. 7 illustrates a more detailed block diagram for implementing various embodiments of the methods or systems for implementing electronic circuit design with simulation awareness.

FIG. 7 illustrates a similar method or system as that illustrated in FIG. 6. In some embodiments, the method or the system illustrated in FIG. 7 comprises the process or module for reducing the parasitics, such as the net-level coupling or coupling lumped to ground, for at least one set of nets (706) after the process or module of characterizing electrical parasitic(s) associated with the physical data by using similar approach(es) or methodology(ies) as described in some of the preceding paragraphs with reference to FIGS. 2C, 4A, and 6. The processes or modules 702, 704, 708, 710, and 712 as well as the computing node 700 are substantially to the corresponding processes or modules illustrated in FIGS. 1-6 and thus will not be repeated here.

Figure 8:
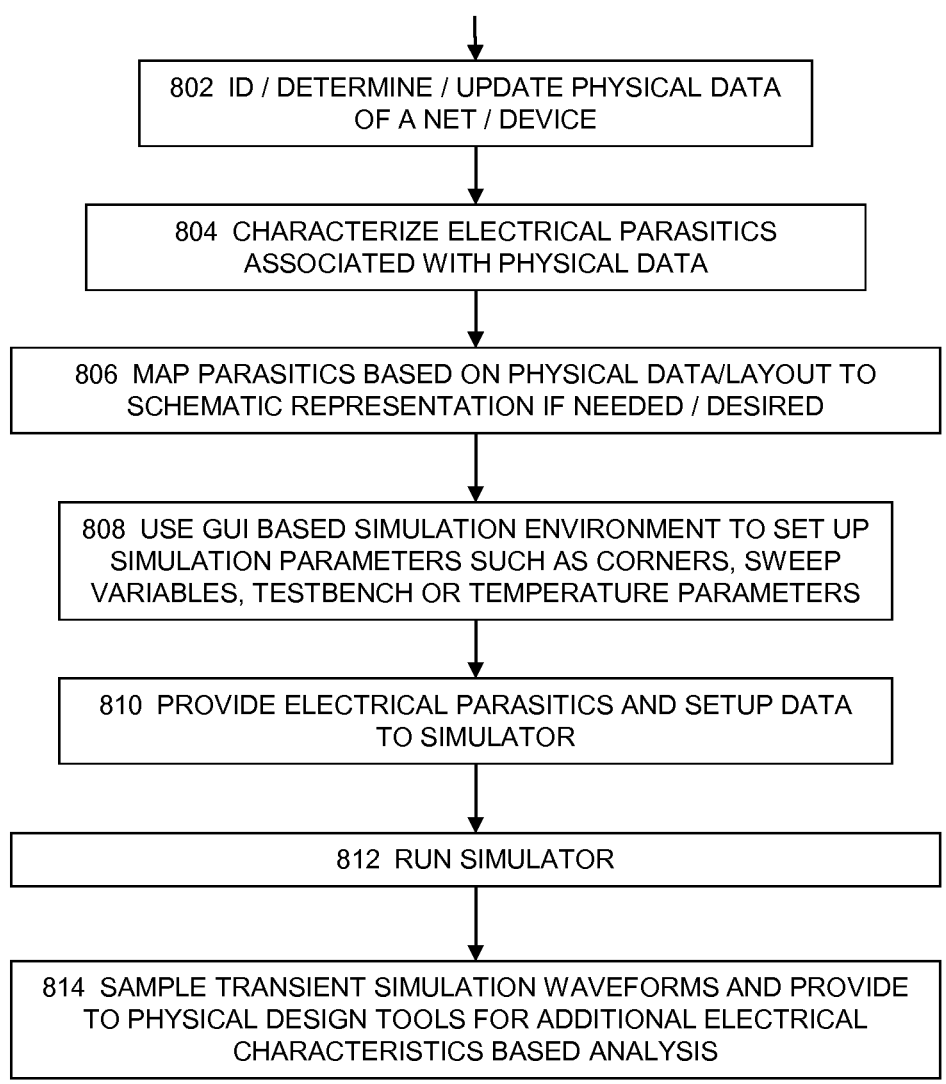
FIG. 8 illustrates a more detailed block diagram for implementing various embodiments of the methods or systems for implementing electronic circuit design with simulation awareness.

FIG. 8 illustrates a top level block diagram for a method or a system for implementing electronic circuit designs with simulation awareness in some embodiments. The flow of the processes or the invocation of the modules as illustrated in FIG. 8 is similar to that in FIG. 4A. In addition to some or all of the processes or modules that are substantially similarly described with reference to FIG. 4A, the method or the system as illustrated in FIG. 8 may further comprise the process or module for using a GUI (graphical user interface) based simulation environment to set up simulation parameters (808) in some embodiments. The simulation parameters may comprise, for example but not limited to, corners, sweep variables, test bench, or temperature or thermal parameters, etc. in some embodiments. The method or the system may further comprise the process or module for sampling the transient simulation waveforms (814) in some embodiments. In these embodiments, the method or the system may further comprise the process or module for providing one or more results of the process or module of sampling the transient simulation waveforms to one or more physical design tools for additional electrical characteristics based analysis. The processes or modules 802, 804, 806, 810, and 812 as well as the computing node 800 are substantially to the corresponding processes or modules illustrated in FIGS. 1-7 and thus will not be repeated here.

Figure 9:
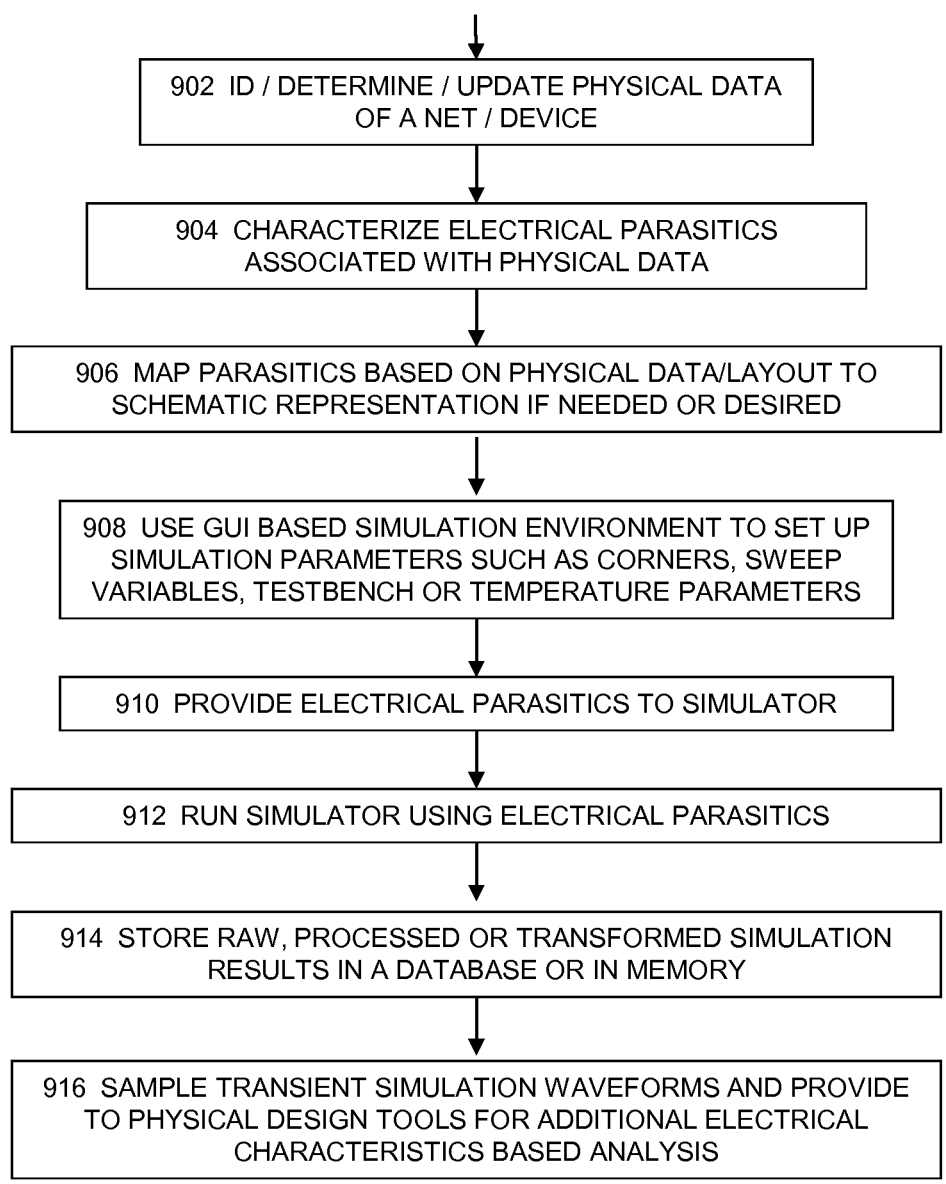
FIG. 9 illustrates a more detailed block diagram for implementing various embodiments of the methods or systems for implementing electronic circuit design with simulation awareness.

FIG. 9 illustrates a top level block diagram for a method or a system for implementing electronic circuit designs with simulation awareness in some embodiments. The flow of the processes or the invocation of the modules as illustrated in FIG. 9 is similar to that in FIG. 8. In addition to some or all of the processes or modules that are substantially similarly described with reference to FIG. 8, the method or the system as illustrated in FIG. 9 may further comprise the process or module for storing the original (e.g., raw data), processed, or transformed simulation result(s) in a database or in other types of data structure(s) in a computer readable storage medium (914) in one or more embodiments. The other processes or modules 902, 904, 906, 908, 910, 912, and 916 as well as the computing node 900 are substantially to the corresponding processes or modules illustrated in FIGS. 1-8 and thus will not be repeated here.

Figure 10:
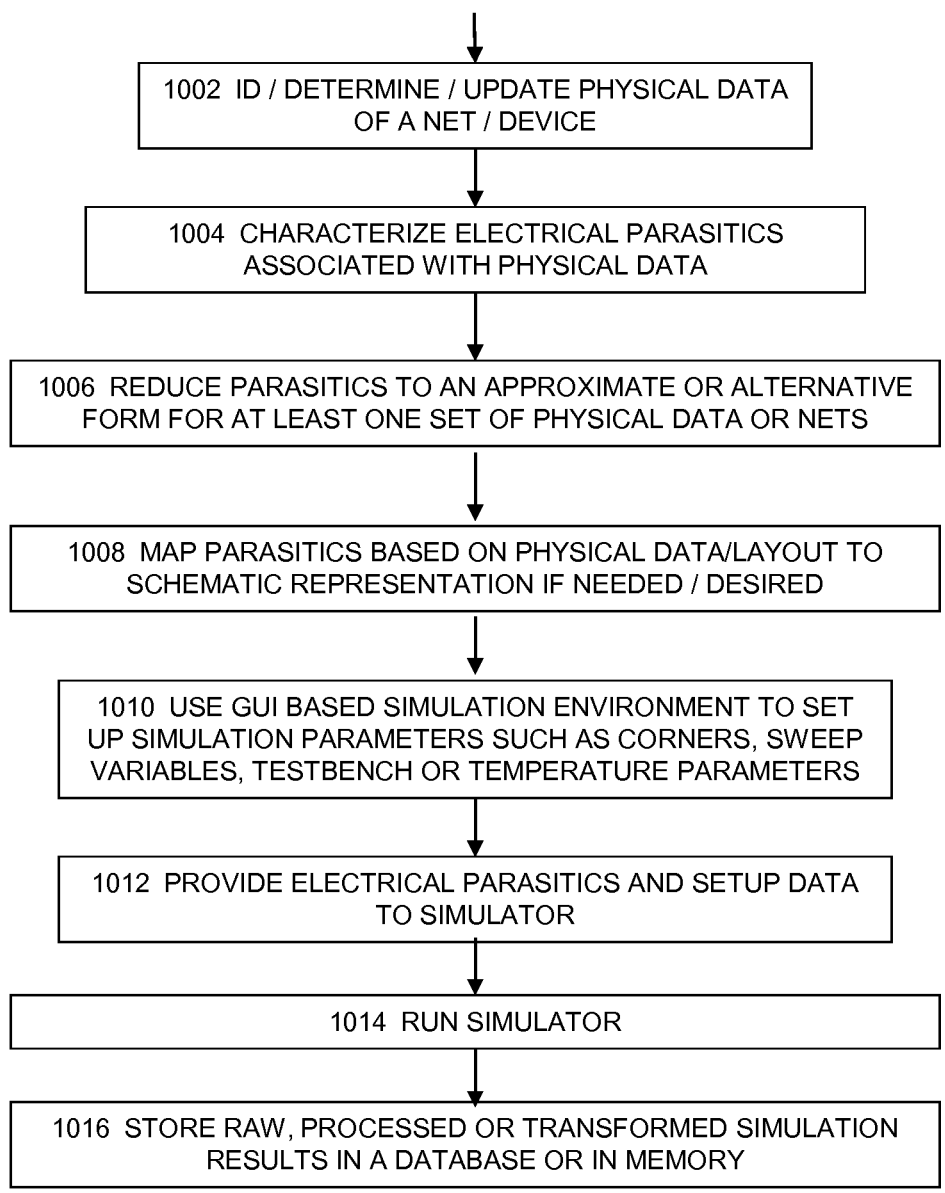
FIG. 10 illustrates a more detailed block diagram for implementing various embodiments of the methods or systems for implementing electronic circuit design with simulation awareness.

FIG. 10 illustrates a top level block diagram for a method or a system for implementing electronic circuit designs with simulation awareness in some embodiments. The flow of the processes or the invocation of the modules as illustrated in FIG. 9 is similar to that in FIG. 8. In addition to some or all of the processes or modules that are substantially similarly described with reference to FIG. 8, the method or the system as illustrated in FIG. 10 may further comprise the process or module for reducing the parasitics to an approximate or alternative form for at least one set of physical data or net(s) before mapping the electrical parasitics (1006) in some embodiments. The other processes or modules 1002, 1004, 1008, 1010, 1012, 1014, and 1016 as well as the computing node 1000 are substantially to the corresponding processes or modules illustrated in FIGS. 1-9 and thus will not be repeated here.

Figure 11:
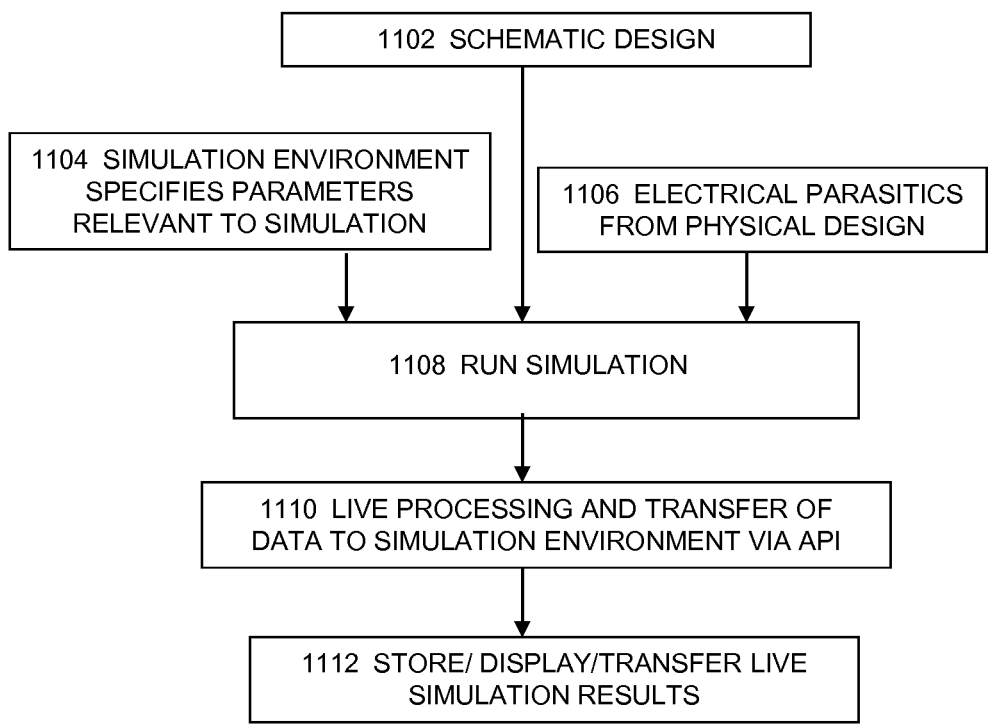
FIG. 11 illustrates a more detailed block diagram for implementing various embodiments of the methods or systems for implementing electronic circuit design with simulation awareness.

FIG. 11 illustrates a top level block diagram for a method or a system for implementing electronic circuit designs with simulation awareness in some embodiments. In a single embodiment or in some embodiments, the method or the system comprises the process or module of identifying or creating a schematic design of an electronic circuit (1102). In some embodiments, the method or the system may comprise the process or module of performing one or more simulations based at least in part upon the schematic design (1108).

In some embodiments, the process or module of performing one or more simulations may further comprise the process or module of specifying one or more parameters that are relevant to the simulation (1104) and/or identifying or receiving one or more electrical parasitics from the physical design or a portion thereof (1106) in some embodiments. The method or the system may further comprise the process or module for providing live processing and transfer of data to the simulation environment via, for example, one or more application programming interfaces (APIs) (1110) in some embodiments. The method or the system may optionally comprise the process or module for storing, displaying, or transferring the live simulation result(s) (1112) in one or more embodiments.

Figure 12:
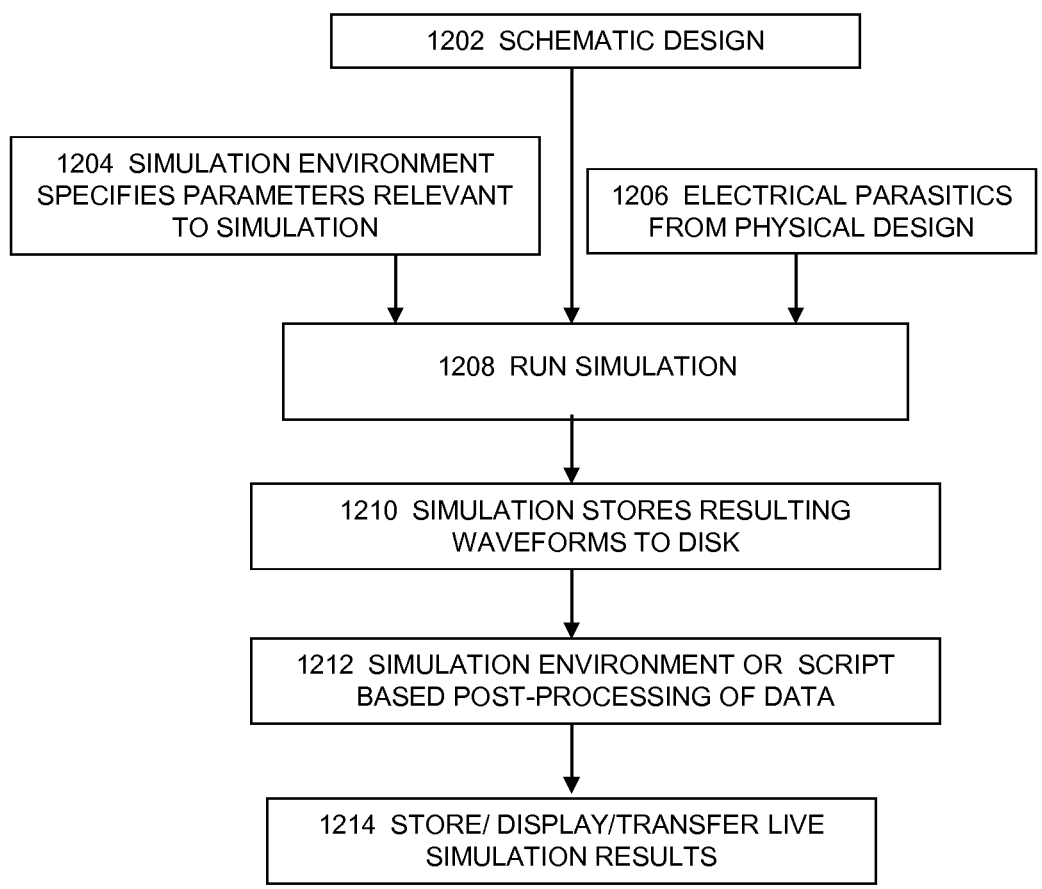
FIG. 12 illustrates a more detailed block diagram for implementing various embodiments of the methods or systems for implementing electronic circuit design with simulation awareness.

FIG. 12 illustrates a top level block diagram for a method or a system for implementing electronic circuit designs with simulation awareness in some embodiments. In a single embodiment or in some embodiments, the method or the system comprises the process or module of identifying or creating a schematic design of an electronic circuit (1202). In some embodiments, the method or the system may comprise the process or module of performing one or more simulations based at least in part upon the schematic design (1208).

In some embodiments, the process or module of performing one or more simulations may further comprise the process or module of specifying one or more parameters that are relevant to the simulation (1204) and/or identifying or receiving one or more electrical parasitics from the physical design or a portion thereof (1206) in some embodiments. The process or module of performing one or more simulations may further be performed based at least in part upon the one or more parameters or the one or more electrical parasitics (1208) in some embodiments. The method or the system may also comprise storing one or more waveforms that result from the one or more simulations to a computer readable storage medium (1214) in one or more embodiments. The method or the system may further comprise the process or module of post-processing various data or results of the one or more simulations in the simulation environment or by using one or more scripts (1212) in one or more embodiments. In addition or in the alternative, the method or the system may comprise the process or module for storing the one or more live simulation results in a computer readable storage medium, displaying the one or more live simulation results in a user interface, or transferring the one or more live simulation results (1214).

Figure 13:
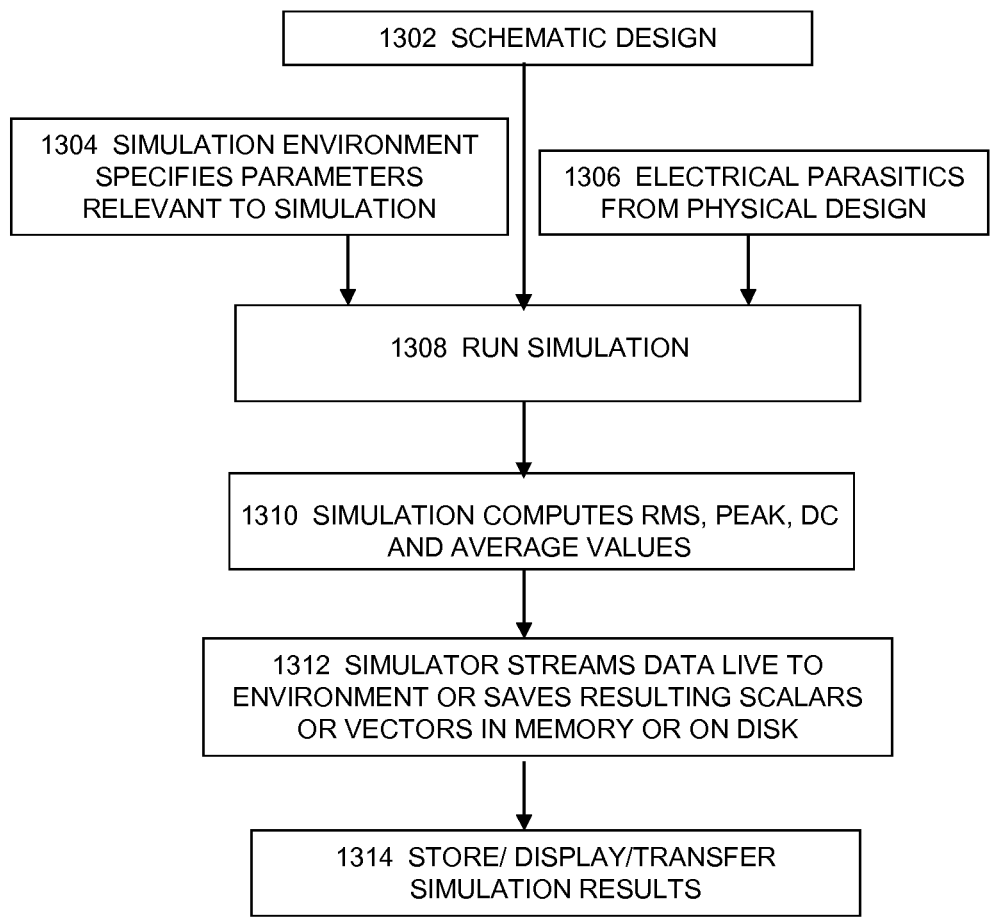
FIG. 13 illustrates a more detailed block diagram for implementing various embodiments of the methods or systems for implementing electronic circuit design with simulation awareness.

FIG. 13 illustrates a top level block diagram for a method or a system for implementing electronic circuit designs with simulation awareness in some embodiments. In a single embodiment or in some embodiments, the method or the system comprises the process or module of identifying or creating a schematic design of an electronic circuit (1302). In some embodiments, the method or the system may comprise the process or module of performing one or more simulations based at least in part upon the schematic design (1308).

In some embodiments, the process or module of performing one or more simulations may further comprise the process or module of specifying one or more parameters that are relevant to the simulation (1304) and/or identifying or receiving one or more electrical parasitics from the physical design or a portion thereof (1306) in some embodiments. The process or module of performing one or more simulations (1308) may further be performed based at least in part upon the one or more parameters or the one or more electrical parasitics in some embodiments. The process or module of performing one or more simulations may further comprise the process or module of computing currents (1310) in some embodiments. In some embodiments, the currents comprise RMS (root-mean-square) current(s), the peak current(s), the DC (direct current) current(s), the average current(s), or a combination thereof.

The method or the system may further comprise streaming data or result(s) of the one or more simulations live to the simulation or physical design environment (1312) in some embodiments. The method or the system may further comprise the process or the module for storing the data, results, various scalars or vectors that result from the one or more simulations in a computer readable storage medium (1314). In addition or in the alternative, the method or the system may further comprise the process or module of storing the one or more live simulation results in a computer readable storage medium, displaying the one or more live simulation results in a user interface, or transferring the one or more live simulation results.

Figure 14:
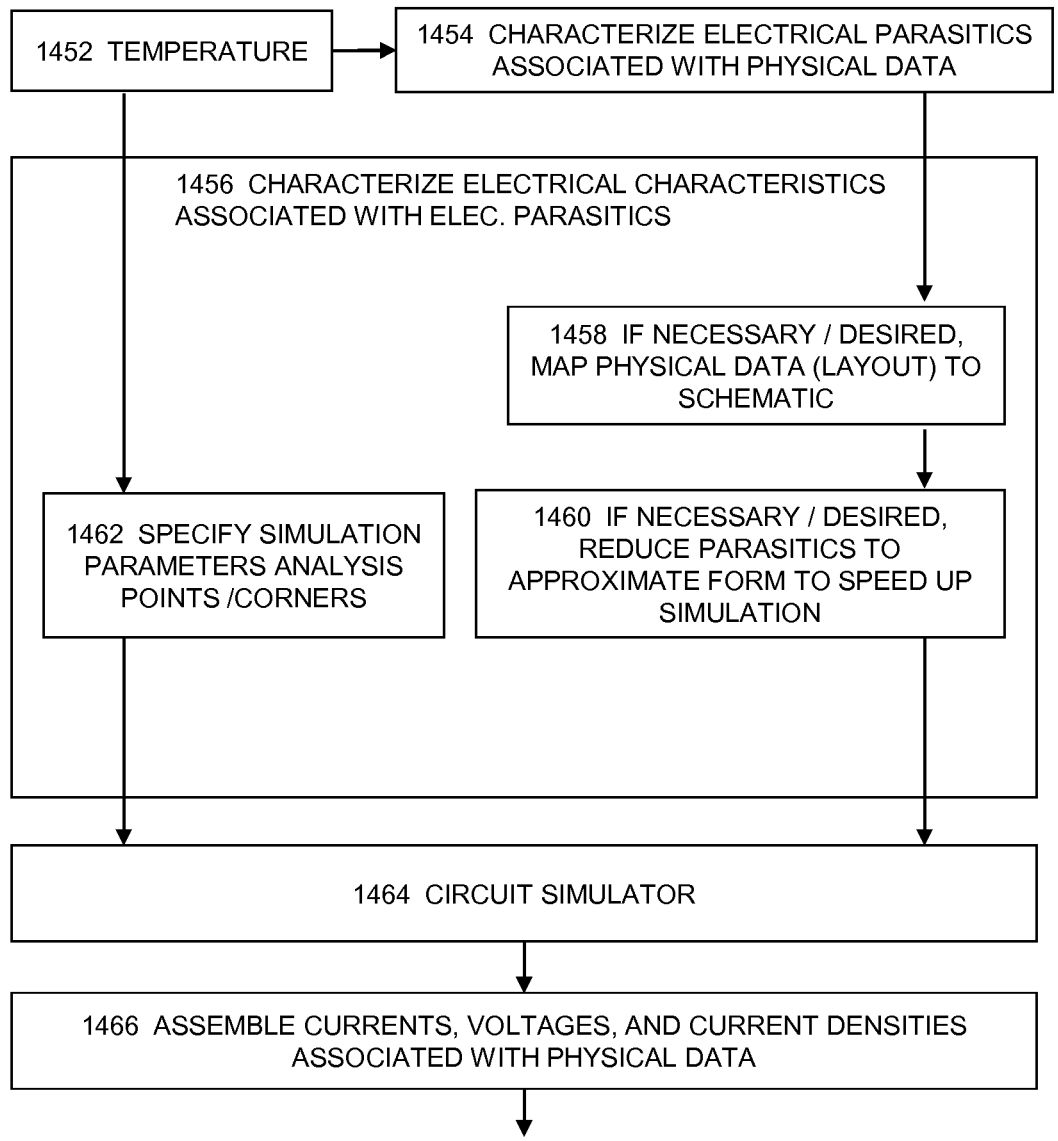
FIG. 14 illustrates a more detailed block diagram for implementing various embodiments of the methods or systems for implementing electronic circuit design with simulation awareness including the process or module for characterizing the electrical characteristics associated with electrical parasitics.

FIG. 14 illustrates more details for the process or module of characterizing electrical characteristics associated with electrical parasitics for various methods or modules as described and illustrated in various preceding paragraphs and figures in some embodiments. In some embodiments, the process or the module for characterizing electrical characteristics (1456) comprises the process or module of mapping the physical data of a component in the layout to the schematic level if necessary or desired (1458). The process or module may further comprise the process or module of reducing the characterized electrical parasitics associated with the physical data to one or more approximate forms to speed up simulation (1460) in some embodiments.

In some embodiments, the process or module for characterizing the electrical parasitics associated with the physical data may further take some temperature or thermal data (1452) into account when characterizing the electrical parasitics (1454). The temperature or thermal data (1452) may also be forwarded to the process or module for specifying one or more simulation parameters, analysis points, or corners for the characterization of the electrical characteristics associated with the electrical parasitics (1462) in one or more embodiments. The specified simulation parameters, analysis points, or analysis corners may then be forward to the process or module of performing one or more simulations (1464) to characterize the electrical characteristics (1466) in some embodiments.

For example, the process or module may perform one or more simulations (1464) to determine current(s), voltage(s), and/or current density(ies) that is (are) associated with the physical data in some embodiments. In some embodiments, the reduced electrical parasitics may also be forward to the process or module for performing one or more simulations to characterize the electrical characteristics. The method or the system may then assemble the characterized electrical characteristics (e.g., the current(s), voltage(s), and/or current density(ies)) that are associated with the physical data (1466) in some embodiments.

Figure 15:
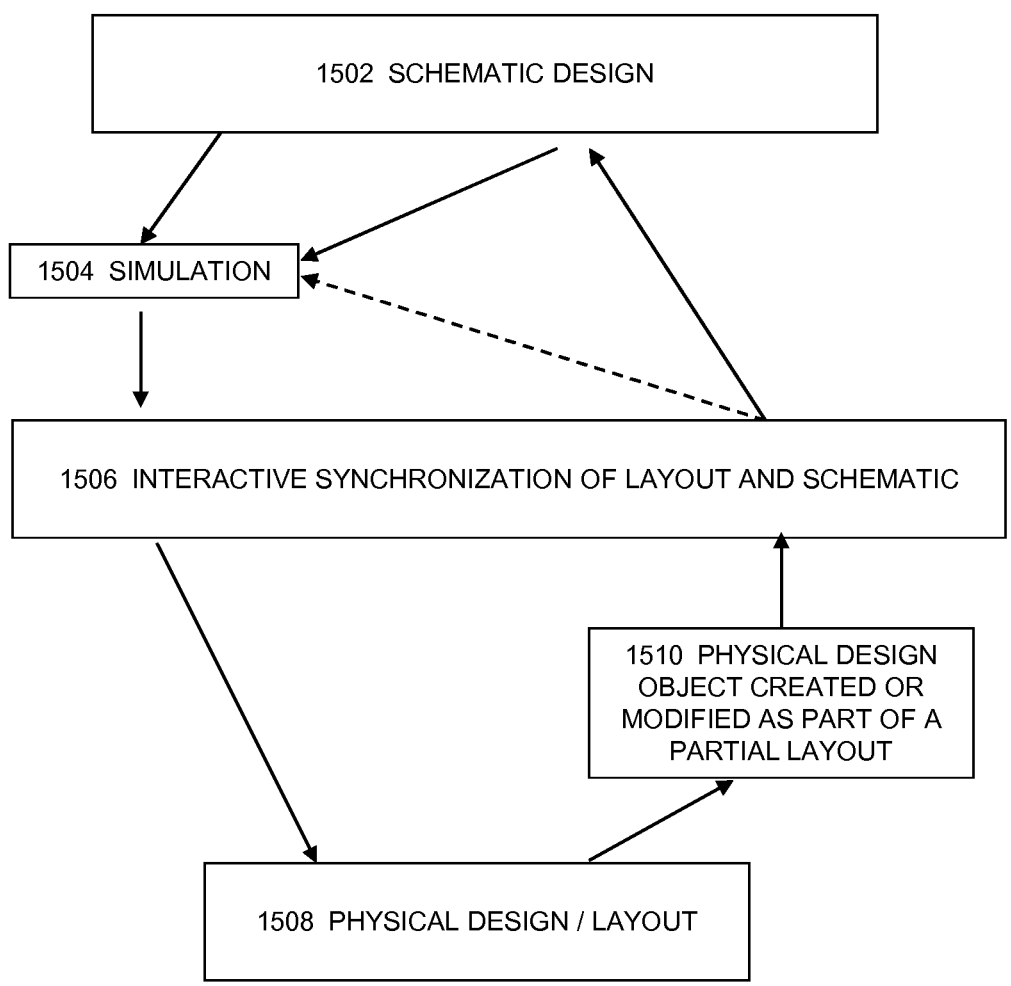
FIG. 15 illustrates a top level block diagram for implementing various embodiments of the methods or systems for implementing electronic circuit design with simulation awareness.

FIG. 15 illustrates a top level block diagram for the method or system for implementing electronic circuit designs with simulation awareness. In some embodiments, the method or system starts with identifying or creating a schematic design of an electronic circuit at 1502 and proceeds to perform one or more simulations at the schematic level at 1504. The method or the system may further comprise the process or module of performing interactive synchronization of the physical design (e.g., a layout) and the schematic design 1506 by using, for example, the mapping process or the binder process as described in the preceding paragraphs, in some embodiments.

The method or the system may then proceed to the physical design level 1508 to identify, create, or modify a net, a device, or a component (hereinafter component) of a partial layout or a complete layout 1510 in some embodiments. Once the net, device, or component in the physical design is identified, created, or modified at 1510, the method or the system may then perform the process or invoke the module 1506 to further perform the interactive synchronization of the physical design and schematic to map the physical data of the identified, created, or modified component to the schematic design in some embodiments.

The method or the system may then proceed to perform the process 1504 or invoke the module 1504 to further perform one or more simulations in some embodiments. In some other embodiments, after the method or the system performs the process 1506 or invokes the module 1506, the method or the system may first proceed to update the schematic design (1502) and then proceeds to 1504 to perform one or more simulations based on the updated schematic design.

Figure 16:
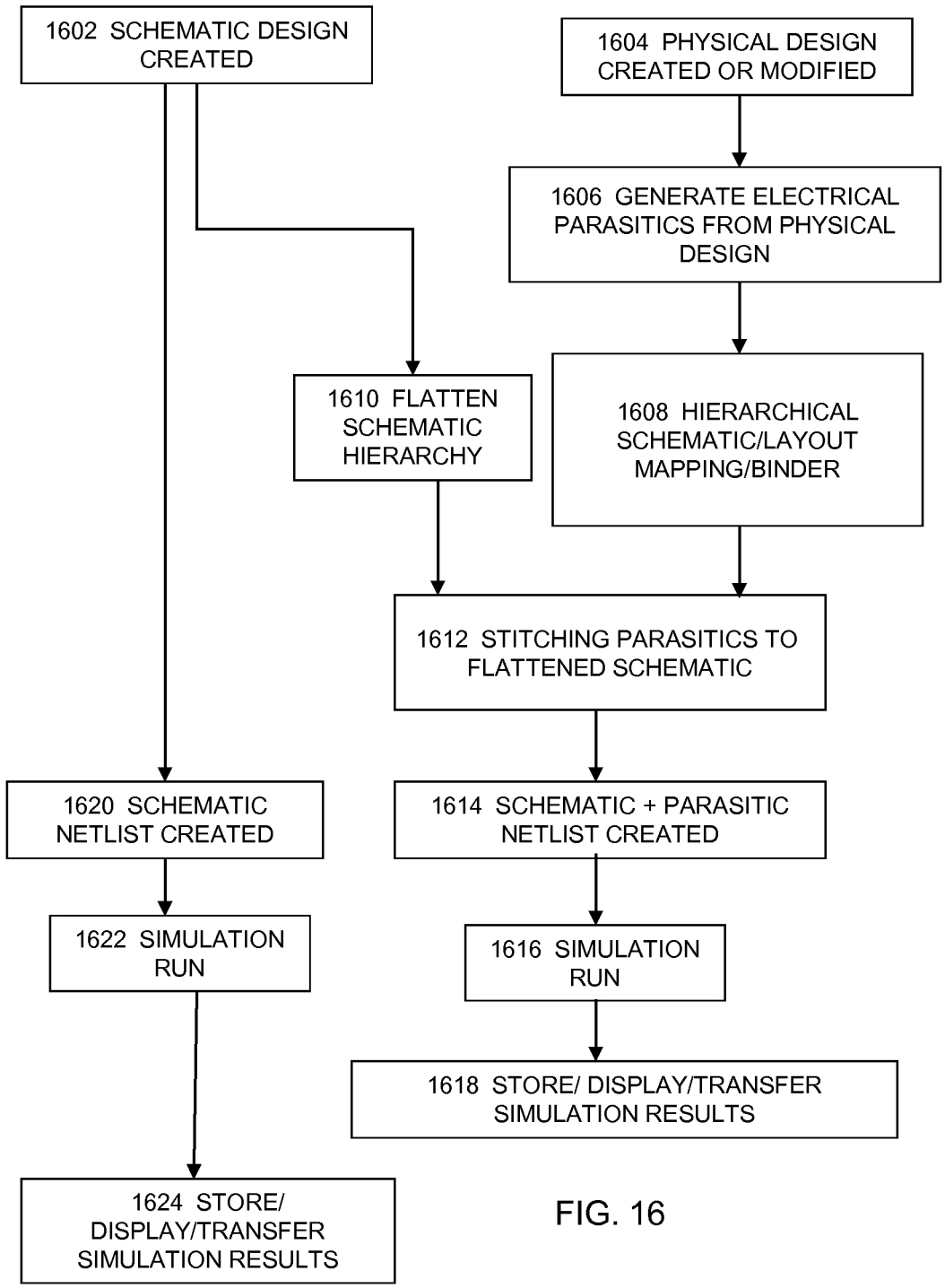
FIG. 16 illustrates a more detailed block diagram for implementing various embodiments of the methods or systems for implementing electronic circuit design with simulation awareness.

A detailed flow diagram is shown in FIG. 16 describing a method for analyzing the impact of parasitics from the physical design on the functional behavior of the circuit by stitching parasitics to a flattened schematic in some embodiments.

The process begins with the creation or identification of a schematic that describes the design (1602) in one or more embodiments. The schematic may include one or more schematic circuit elements, various parameters on these schematic elements and a description of the connectivity between these schematic elements. The schematic of the circuit is then used to generate a netlist, which is typically a textual representation of the schematic elements, the parameters on those elements, and the connectivity between those elements (1620). This netlist is passed on to a circuit simulator to simulate the circuit (1622). The results of the simulation may be stored in a computer accessible storage medium, displayed on a display apparatus, or transferred (1624) and may also be used by the designer to analyze the functional behavior of the circuit and ensure that the circuit meets the required design specifications.

As part of the design process, a physical design corresponding to the circuit is created or modified by the layout designer (1604) in some embodiments. The electrical parasitics, such as the resistances and capacitances of the interconnect wires, are extracted from the physical design (1606) in some embodiments.

In order to evaluate the impact of these parasitics on the functional behavior of the circuit, these parasitics may need to be mapped and stitched to a flattened representation of the schematic (1608) in some embodiments. In these embodiments, the flattening of the schematic hierarchy (1610) enables the capturing of the unique representations of circuit elements in embodiments where multiple instances of the same circuit element exist within the hierarchy. The flattening process (1610) mimics an elaboration of the schematic that is performed by the simulator in the original simulation of the schematic without parasitics as described in several preceding paragraphs with reference to the respective figures.

The components used in the physical design to implement the devices in the layout may not necessarily have the same names as the ones used on the schematic in some embodiments. In these embodiments, they may have different names for the terminals and nets representing their connectivity on the layout. There might further be several components on the layout corresponding to the same circuit element on the schematic; for example, m-factor parameters on schematic devices may cause a 1-to-M mapping between circuit element instances on the schematic and the physical component instances on the layout. In some embodiments, the design hierarchy might differ between the schematic and the layout. For example, there could be multiple levels of schematic hierarchy corresponding to a single level of layout hierarchy. There may further be several levels of layout hierarchy as well in some embodiments.

The connection nodes of the parasitics on the layout therefore need to be correctly mapped to their schematic counterparts in order to be able to correctly stitch these parasitics into the schematic domain. The hierarchical schematic/layout binding process in the process flow performs such a mapping of devices from the layout hierarchy to the schematic hierarchy while taking into account the various mappings between the schematic and layout devices, including differences in names of devices and/or nets, differences in names of terminals and 1-to-M mappings between schematic and layout devices.

Once the parasitic node names are mapped to the schematic nodes names, the stitching process inserts parasitic schematic components on the flattened schematic (1612) in some embodiments. This process removes original wired connections for each of the nets on the schematic with their corresponding parasitic network elements.

Often times, the layout is not fully complete in some embodiments. In these embodiments, the partial layout may only contain layout components corresponding to certain critical devices in the layout. The layout may further only contain routing information for certain critical nets. In such cases, only the parasitic elements corresponding to elements in the parasitic layout are mapped back to the schematic. Only those elements are stitched in to the flattened schematic in these embodiments.

The resulting flattened schematic with parasitic elements may be used to create a netlist (1614) for simulation purposes (1616) in some embodiments. The netlist contains the circuit description with devices from the original schematic representation and the additional parasitic devices corresponding to the parasitics fetched and mapped from the layout. This netlist is passed on to a circuit simulator to simulate the functional behavior of the circuit with parasitics (1616). The results of the simulation may be stored in a computer accessible storage medium, displayed on a display apparatus, or transferred (1618) and may also be used by the designer to analyze the functional behavior of the circuit and evaluate if the circuit meets the required design specifications in the presence of parasitics from the layout.

Figure 17:
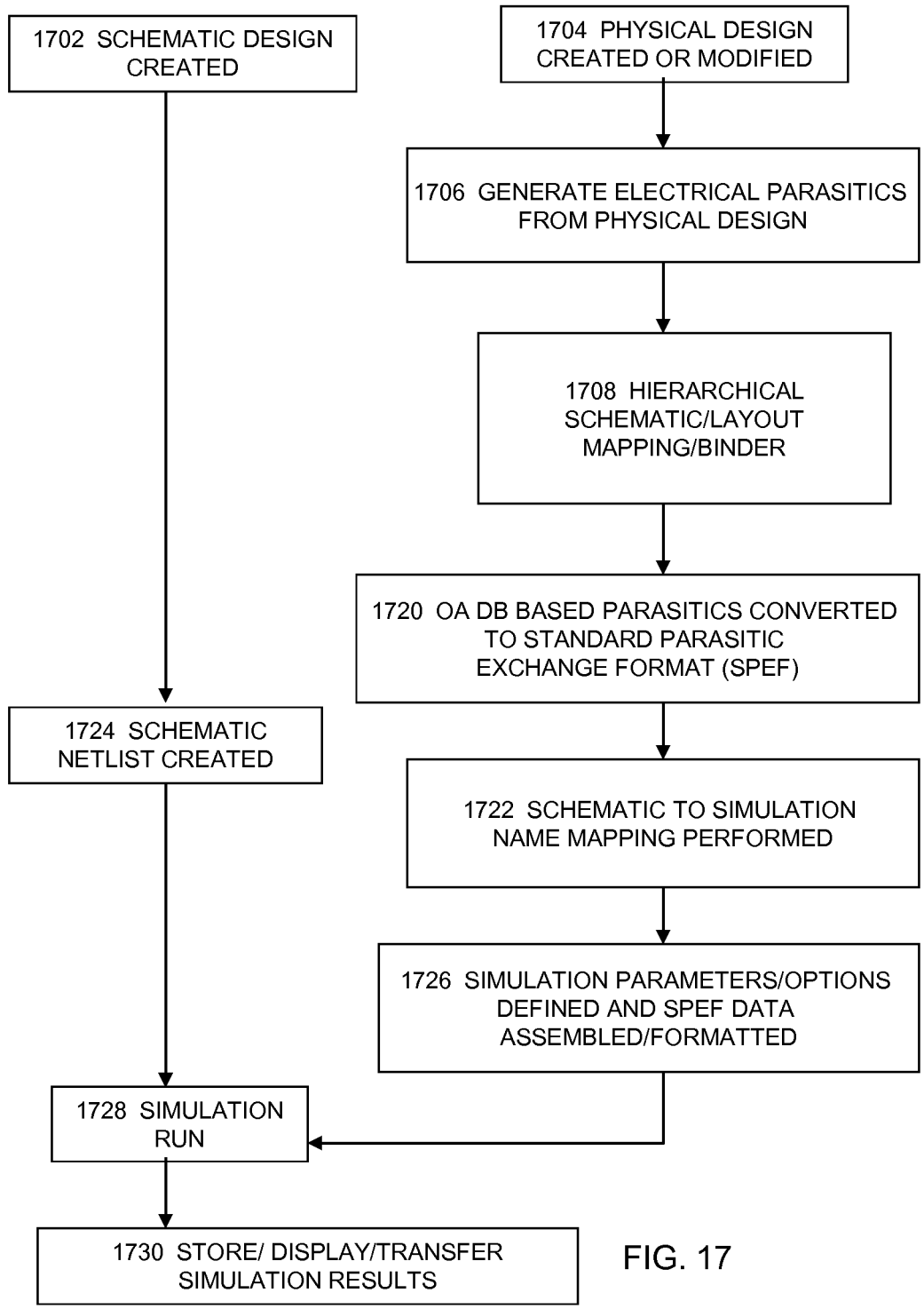
FIG. 17 illustrates a more detailed block diagram for implementing various embodiments of the methods or systems for implementing electronic circuit design with simulation awareness.

A detailed flow diagram is shown in FIG. 17 describing a method for analyzing the impact of parasitics from the physical design on the functional behavior of the circuit by stitching parasitics within the simulator through a standard parasitic exchange format in some embodiments.

The process begins with the identification or creation of a schematic that describes the design (1702) in some embodiments. In these embodiments, the schematic may include one or more schematic circuit elements, various parameters on these schematic elements, and a description of the connectivity between these schematic elements. The schematic of the circuit may then be used to generate a netlist (1724), which is typically a textual representation of the schematic elements, the parameters on those elements and the connectivity between those elements. This netlist is passed on to a circuit simulator to simulate the circuit (1728). The results of the simulation may be stored in a computer accessible storage medium, displayed on a display apparatus, or transferred (1730) and may also be used by the designer to analyze the functional behavior of the circuit and ensure that the circuit meets the required design specifications.

As part of the design process, a physical design corresponding to the circuit is created or modified by the layout designer (1704) in one or more embodiments. The electrical parasitics, such as the resistances and capacitances of the interconnect wires, are extracted from the physical design (1706) in some embodiments.

In order to evaluate the impact of these parasitics on the functional behavior of the circuit, these parasitics need to be mapped to a flattened representation of the circuit as seen by the simulator. The flattened representation mimics an elaboration of the schematic that is performed by the simulator in the original simulation of the schematic without parasitics as described in various paragraphs with reference to the corresponding figures above in various embodiments.

The components used in the physical design to implement the devices in the layout may not necessarily have the same names as the ones used on the schematic in some embodiments. In these embodiments, they may have different names for the terminals and nets representing their connectivity on the layout. There might further be several components on the layout corresponding to the same circuit element on the schematic in some embodiments; for example, m-factor parameters on schematic devices can cause a 1-to-M mapping between circuit elements instances on the schematic and physical component instances on the layout. Further, the design hierarchy might differ between the schematic and the layout in some embodiments. For example, there could be multiple levels of schematic hierarchy corresponding to a single level of layout hierarchy. There could also be several levels of layout hierarchy as well in some embodiments.

The connection nodes of the parasitics on the layout therefore need to be correctly mapped to their schematic counterparts in order to be able to correctly stitch these parasitics into the schematic domain in some embodiments. In these embodiments, the hierarchical schematic/layout binding process in the process flow as described above performs such a mapping of devices from the layout hierarchy to the schematic hierarchy while taking into account the various mappings between the schematic and layout devices, including differences in names of devices and/or nets, differences in names of terminals, and 1-to-M mappings between schematic and layout devices (1708) in one or more embodiments.

To simulate the circuit with parasitics, the parasitic network information needs to be communicated to the simulator. The parasitics in the layout are typically stored within the Open Access (OA) database (DB) representation. These OA DB based parasitics are converted to a Standard Parasitics Exchange Format (SPEF) (1720) in some embodiments. This is typically a textual representation of the parasitic network information in some embodiments.

In order for the simulator to be able to read in the parasitic information from the SPEF Data and stitch into the schematic netlist, the names of the connection nodes of the parasitic network in the SPEF Data need to correspond to nodes of the circuit device components in the original schematic netlist provided to the simulator in some embodiments. Name Mapping is therefore performed to convert the names of the parasitic connection nodes from the schematic namespace to the simulation namespace (1722) in these embodiments.

Various simulation parameters and stitching options are further defined to direct the simulator to stitch in the assembled and formatted SPEF DATA (1726) in some embodiments. Such options might include directives for the simulator to stitch in SPEF DATA for multiple nets from multiple SPEF DATA files.

Often times, the layout is not fully complete. The partial layout may only contain layout components corresponding to certain critical devices in the layout in some embodiments. The layout may further only contain routing information for certain critical nets. In such embodiments, only the parasitic elements corresponding to elements in the parasitic layout are mapped back to the schematic and inserted into the SPEF DATA.

The stitching of the SPEF parasitic data to the original schematic netlist is performed by the simulator (1728) in some embodiments. This approach has the advantage that another schematic netlist need not be explicitly created for the simulator. The simulator may work off the original schematic netlist that was generated to simulation without parasitics.

The simulator performs a simulation of the circuit with devices from the original schematic representation and the additional parasitic elements corresponding to the parasitics fetched and mapped from the layout in some embodiments. The results of the simulation may be stored in a computer accessible storage medium, displayed on a display apparatus, or transferred (1730) and may also be used by the designer to analyze the functional behavior of the circuit and evaluate if the circuit meets the required design specifications in the presence of parasitics from the layout.

Figure 18:
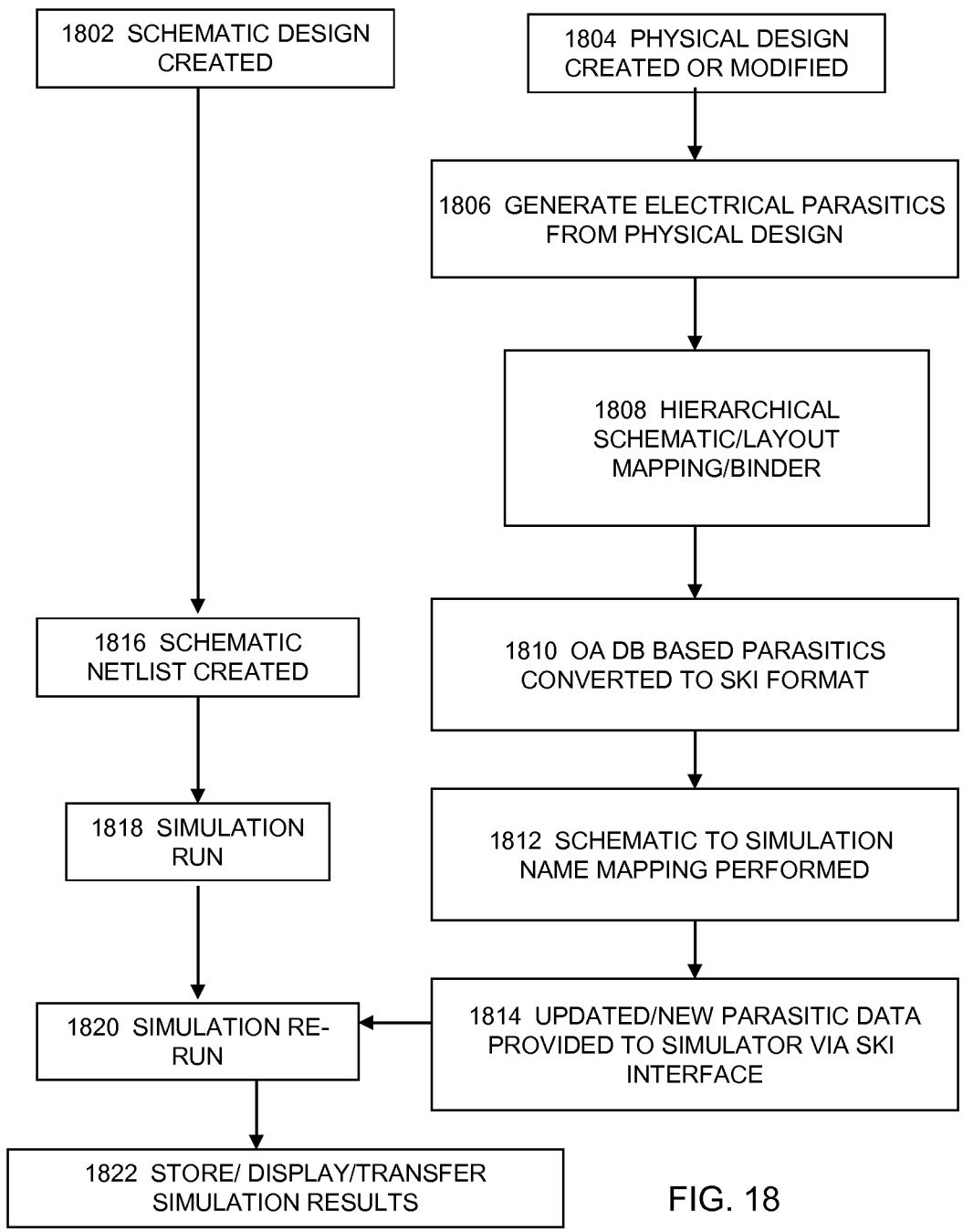
FIG. 18 illustrates a more detailed block diagram for implementing various embodiments of the methods or systems for implementing electronic circuit design with simulation awareness.

FIG. 18 is a detailed flow diagram describing a method for analyzing the impact of parasitics from the physical design on the functional behavior of the circuit by stitching parasitics interactively within the simulator through a simulation kernel interface in some embodiments.

The process begins with the identification or creation of a schematic that describes the design (1802) in one or more embodiments. The schematic may include one or more schematic circuit elements, various parameters on these schematic elements, and a description of the connectivity between these schematic elements in some embodiments. The schematic of the circuit is then used to generate a netlist, which is typically a textual representation of the schematic elements, the parameters on those elements and the connectivity between those elements (1816) in some embodiments. This netlist is passed on to a circuit simulator to simulate the circuit (1818) in these embodiments. The results of the simulation may be stored in a computer accessible storage medium, displayed on a display apparatus, or transferred (1822) and may also be used by the designer to analyze the functional behavior of the circuit and ensure that the circuit meets the required design specifications in these embodiments.

The simulator may however be configured to run in an interactive mode within the design/simulation environment, with the capability of accepting further inputs from the environment via a simulation kernel interface (SKI interface) (1814) in some embodiments. Such an interface allows further incremental re-runs of the same simulator process by accepting incremental design or parameter changes from the design environment in some embodiments. The following paragraphs describe how this incremental re-run mode may be used to analyze the impact of parasitics interactively in some embodiments.

As part of the design process, a physical design corresponding to the circuit is created or modified by the layout designer (1804) in one or more embodiments. The electrical parasitics, such as the resistances and capacitances of the interconnect wires, are extracted from the physical design (1806) in some embodiments.

In order to evaluate the impact of these parasitics on the functional behavior of the circuit, these parasitics need to be mapped to a flattened representation of the circuit as seen by the simulator in some embodiments. The flattened representation mimics an elaboration of the schematic that is performed by the simulator in the original simulation of the schematic without parasitics as described in various paragraphs with reference to the corresponding figures above.

The components used in the physical design to implement the devices in the layout may not necessarily have the same names as the ones used on the schematic in some embodiments. In these embodiments, they may have different names for the terminals and nets representing their connectivity on the layout. There might further be several components on the layout corresponding to the same circuit element on the schematic; for example, m-factor parameters on schematic devices can cause a 1-to-M mapping between circuit element instances on the schematic and physical component instances on the layout. Further, the design hierarchy might differ between the schematic and the layout in some embodiments. For example, there could be multiple levels of schematic hierarchy corresponding to a single level of layout hierarchy. There may also be several levels of layout hierarchy as well in some embodiments.

The connection nodes of the parasitics on the layout therefore need to be correctly mapped to their schematic counterparts in order to be able to correctly stitch these parasitics into the schematic domain. The hierarchical schematic/layout binding process in the process flow performs such a mapping of devices from the layout hierarchy to the schematic hierarchy while taking into account the various mappings between the schematic and layout devices, including differences in names of devices and/or nets, differences in names of terminals, and 1-to-M mappings between schematic and layout devices (1808) in some embodiments.

To simulate the circuit with parasitics, the parasitic network information needs to be communicated to the simulator. The parasitics in the layout are typically stored within the Open Access (OA) database (DB) representation. These OA DB based parasitics are converted to Simulation Kernel Interface (SKI) format (1810) in some embodiments. This is a format suitable to pass the parasitic network information from the environment via a simulation kernel interface. Such a format allows the design environment to pass incremental changes from the layout, in the form of new/modified parasitics to the simulator.

In order for the simulator to be able to read in the parasitic information from the SKI Data and stitch into the schematic netlist, the names of the connection nodes of the parasitic network in the SPEF Data need to correspond to nodes of the circuit device components in the original schematic netlist provided to the simulator in some embodiments. Name Mapping is therefore performed to convert the names of the parasitic connection nodes from the schematic namespace to the simulation namespace (1812) in some embodiments.

Often times, the layout is not fully complete in some embodiments. In these embodiments, the partial layout may only contain layout components corresponding to certain critical devices in the layout. The layout may further only contain routing information for certain critical nets. In such embodiments, only the parasitic elements corresponding to elements in the partial layout are mapped back to the schematic and inserted into the SKI DATA.

When the simulator is configured to run in an interactive mode within the design/simulation environment, the updated/new parasitic information is provided to the simulator via a simulation kernel interface (1814) in some embodiments. Such an interface allows further incremental re-runs of the same simulator process by accepting incremental changes to the parasitic network information.

The stitching of the SPEF parasitic data to the original schematic netlist is performed by the simulator incrementally. This has the advantage that another schematic netlist and full parasitic information need not be explicitly created for the simulator in some embodiments. In these embodiments, the simulator may work off the original schematic netlist that was generated to simulate without parasitics. Further, for incremental changes within a reasonable scope, the simulator may preserve much of its previous in-memory state and perform a re-simulation of the circuit with just the incremental design changes from the updated/new parasitics.

The simulator performs a simulation of the circuit with devices from the original schematic representation and the additional parasitic elements corresponding to the parasitics fetched and mapped from the layout in some embodiments. The results of the simulation are used by the designer to analyze the functional behavior of the circuit and evaluate if the circuit meets the required design specifications in the presence of parasitics from the layout.

Figure 19:
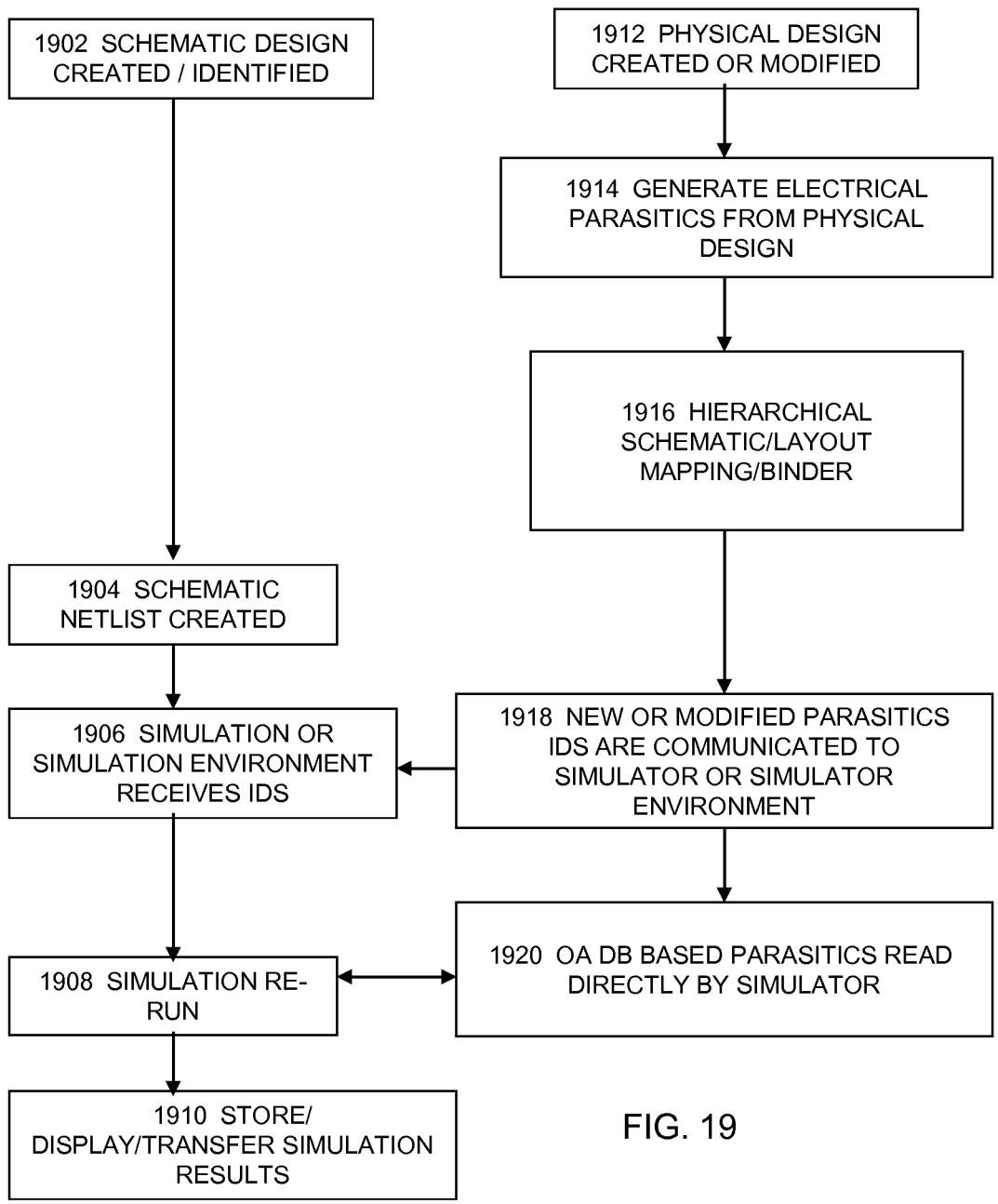
FIG. 19 illustrates a more detailed block diagram for implementing various embodiments of the methods or systems for implementing electronic circuit design with simulation awareness.

FIG. 19 illustrates a detailed flow diagram describing a method or system for analyzing the impact of parasitics from the physical design on the functional behavior of the circuit by stitching parasitics interactively within the simulator by reading OA DB based parasitics in some embodiments.

The process begins with the identification or creation of a schematic that describes the design (1902) in one or more embodiments. The schematic may include one or more schematic circuit elements, various parameters on these schematic elements, and a description of the connectivity between these schematic elements. The schematic of the circuit may then be used to generate a netlist, which is typically a textual representation of the schematic elements, the parameters on those elements and the connectivity between those elements (1904) in some embodiments. This netlist is passed on to a circuit simulator to simulate the circuit (1908) in one or more embodiments. The results of the simulation may be stored in a computer accessible storage medium, displayed on a display apparatus, or transferred (1910) and may also be used by the designer to analyze the functional behavior of the circuit and ensure that the circuit meets the required design specifications.

The simulator may however be configured to run in an interactive mode within the design/simulation environment, with the capability of accepting further inputs from the environment via a simulation kernel interface (SKI) in some embodiments. Such an interface allows further incremental re-runs of the same simulator process by accepting incremental design or parameter changes from the design environment in some embodiments. The following paragraphs describe how this incremental re-run mode may be used to analyze the impact of parasitics interactively in some embodiments.

As part of the design process, a physical design corresponding to the circuit is created or modified by the layout designer (1912) in some embodiments. The electrical parasitics, such as the resistances and capacitances of the interconnect wires, are extracted from the physical design (1914) in some embodiments.

In order to evaluate the impact of these parasitics on the functional behavior of the circuit, these parasitics need to be mapped to a flattened representation of the circuit as seen by the simulator in some embodiments. In these embodiments, the flattened representation mimics an elaboration of the schematic that is performed by the simulator in the original simulation of the schematic without parasitics as described in several preceding paragraphs with reference to the corresponding figures.

The components used in the physical design to implement the devices in the layout may not necessarily have the same names as the ones used on the schematic in some embodiments. In these embodiments, they may have different names for the terminals and nets representing their connectivity on the layout. There might further be several components on the layout corresponding to the same circuit element on the schematic in some embodiments; for example, m-factor parameters on schematic devices can cause a 1-to-M mapping between circuit element instances on the schematic and physical component instances on the layout in some embodiments. Further, the design hierarchy might differ between the schematic and the layout in some embodiments. For example, there could be multiple levels of schematic hierarchy corresponding to a single level of layout hierarchy. There may also be several levels of layout hierarchy as well.

The connection nodes of the parasitics on the layout therefore need to be correctly mapped to their schematic counterparts in order to be able to correctly stitch these parasitics into the schematic domain in some embodiments. The hierarchical schematic/layout binding process in the process flow performs such a mapping of devices from the layout hierarchy to the schematic hierarchy while taking into account the various mappings between the schematic and layout devices, including differences in names of devices and/or nets, differences in names of terminals, and 1-to-M mappings between schematic and layout devices (1916) in some embodiments.

To simulate the circuit with parasitics, the parasitic network information needs to be communicated to the simulator. The parasitics in the layout are typically stored within the Open Access (OA) database (DB) representation (1920) in some embodiments. Sometimes the parasitic information can amount to large amounts of data and converting them to other formats ends up utilizing more disk space. Instead, the simulator may directly read the parasitics from the OA DB. This approach in these embodiments has the advantage that the storage and reading of parasitics is done efficiently. The simulator and the simulation environment only need to convey to the simulator, the ids of parasitic networks that changed (1906). This approach further allows the design environment to pass incremental changes from the layout, in the form of new/modified parasitic ids to the simulator (1918 to 1906) in some embodiments.

In order for the simulator to be able to read in the parasitic information from the OA DB Data and stitch into the schematic netlist, the names of the connection nodes of the parasitic network in the OA DB Data may need to correspond to nodes of the circuit device components in the original schematic netlist provided to the simulator in some embodiments. Name Mapping information is also conveyed to the simulator to map the names of the parasitic connection nodes from the schematic namespace to the simulation namespace.

Often times, the layout is not fully complete in some embodiments. In these embodiments, the partial layout may only contain layout components corresponding to certain critical devices in the layout. The layout may further only contain routing information for certain critical nets in some embodiments. In such embodiments, only the ids of parasitic elements corresponding to elements in the partial layout (1918) are provided to the simulator (1906).

When the simulator is configured to run in an interactive mode within the design/simulation environment, the updated/new parasitic id information is provided to the simulator via a simulation kernel interface (SKI) in some embodiments. Such an interface allows further incremental re-runs of the same simulator process by accepting incremental changes to the parasitic network information.

The stitching of the OA DB parasitic data to the original schematic netlist is performed by the simulator incrementally in some embodiments. This approach in these embodiments has the advantage that another schematic netlist and full parasitic information need not be explicitly created for the simulator in these embodiments. The simulator may work off the original schematic netlist that was generated to simulate without parasitics. Further, for incremental changes within a reasonable scope, the simulator can preserve much of its previous in-memory state and perform a re-simulation of the circuit with just the incremental design changes from the updated/new parasitics in some embodiments.

The simulator performs a simulation of the circuit with devices from the original schematic representation and the additional parasitic elements corresponding to the parasitics fetched and mapped from the layout in some embodiments. The results of the simulation are used by the designer to analyze the functional behavior of the circuit and evaluate if the circuit meets the required design specifications in the presence of parasitics from the layout.

System Architecture Overview

Figure 20:
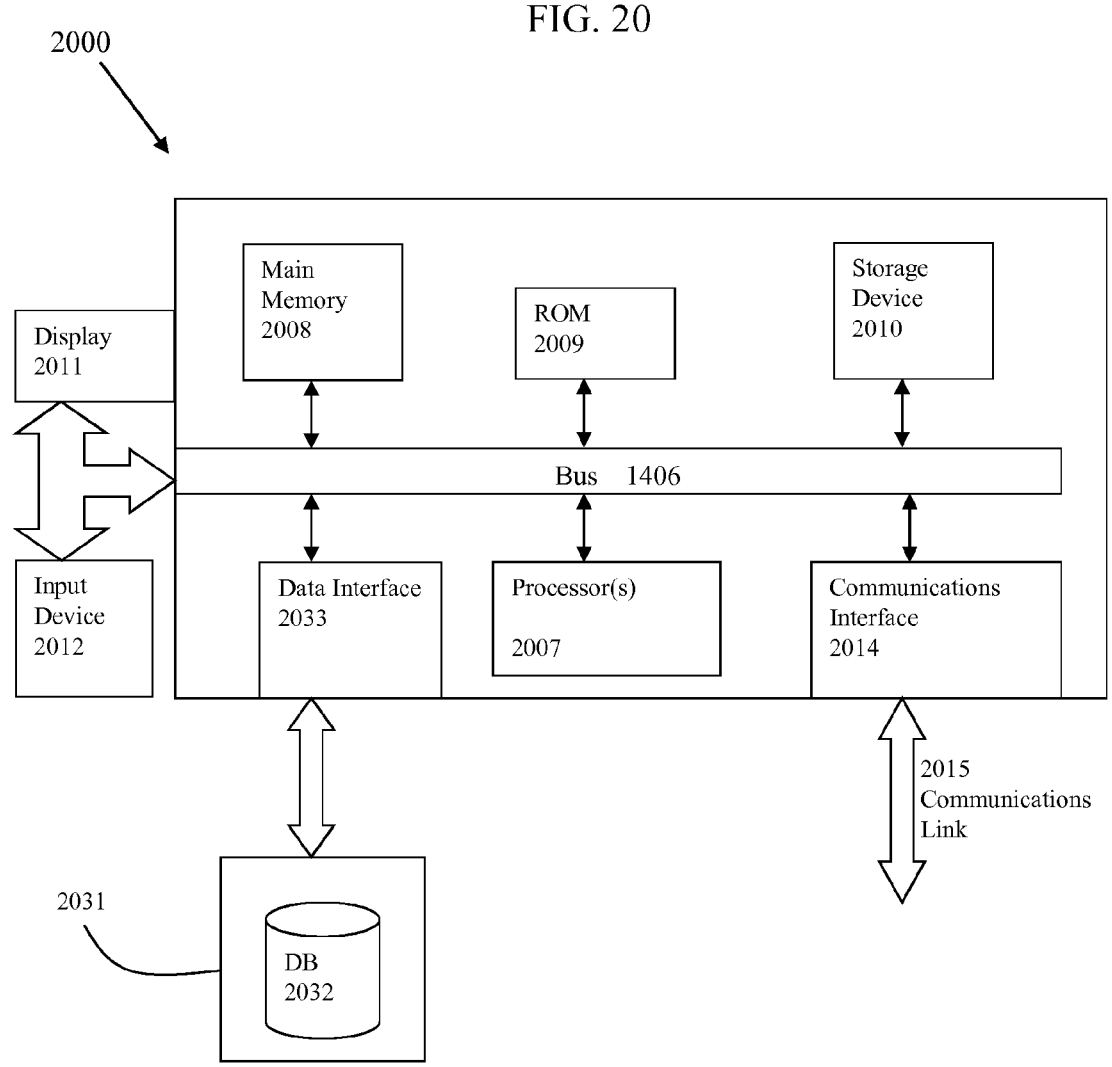
FIG. 20 depicts a computerized system on which a method for timing closure with concurrent process models can be implemented.

FIG. 20 illustrates a block diagram of an illustrative computing system 2000 suitable for implementing some embodiments of the method or system for implementing electronic circuit designs with simulation awareness as described in the preceding paragraphs with reference to various figures. Computer system 2000 includes a bus 2006 or other communication mechanism for communicating information, which interconnects subsystems and devices, such as processor 2007, system memory 2008 (e.g., RAM), static storage device 2009 (e.g., ROM), disk drive 2010 (e.g., magnetic or optical), communication interface 2014 (e.g., modem or Ethernet card), display 2011 (e.g., CRT or LCD), input device 2012 (e.g., keyboard), and cursor control (not shown).

According to one embodiment, computer system 2000 performs specific operations by one or more processor or processor cores 2007 executing one or more sequences of one or more instructions contained in system memory 2008. Such instructions may be read into system memory 2008 from another computer readable/usable storage medium, such as static storage device 2009 or disk drive 2010. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

Various actions or processes as described in the preceding paragraphs may be performed by using one or more processors, one or more processor cores, or combination thereof 2007, where the one or more processors, one or more processor cores, or combination thereof executes one or more threads. For example, the act of specifying various net or terminal sets or the act or module of performing verification or simulation, etc. may be performed by one or more processors, one or more processor cores, or combination thereof.

The term "computer readable storage medium" or "computer usable storage medium" as used herein refers to any medium that participates in providing instructions to processor 2007 for execution. Such a medium may take many forms, including but not limited to, non-volatile media and volatile media. Non-volatile media includes, for example, optical or magnetic disks, such as disk drive 2010. Volatile media includes dynamic memory, such as system memory 2008.

Common forms of computer readable storage media includes, for example, electromechanical disk drives (such as a floppy disk, a flexible disk, or a hard disk), a flash-based, RAM-based (such as SRAM, DRAM, SDRAM, DDR, MRAM, etc.), or any other solid-state drives (SSD), magnetic tape, any other magnetic or magneto-optical medium, CD-ROM, any other optical medium, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 2000. According to other embodiments of the invention, two or more computer systems 2000 coupled by communication link 2015 (e.g., LAN, PTSN, or wireless network) may perform the sequence of instructions required to practice the invention in coordination with one another.

Computer system 2000 may transmit and receive messages, data, and instructions, including program, i.e., application code, through communication link 2015 and communication interface 2014. Received program code may be executed by processor 2007 as it is received, and/or stored in disk drive 2010, or other non-volatile storage for later execution. In an embodiment, the computer system 2000 operates in conjunction with a data storage system 2031, e.g., a data storage system 2031 that contains a database 2032 that is readily accessible by the computer system 2000. The computer system 2000 communicates with the data storage system 2031 through a data interface 2033. A data interface 2033, which is coupled to the bus 2006, transmits and receives electrical, electromagnetic or optical signals that include data streams representing various types of signal information, e.g., instructions, messages and data. In embodiments of the invention, the functions of the data interface 2033 may be performed by the communication interface 2014.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

We claim:

1. A computer implemented method for implementing an electronic circuit design of an electronic circuit with simulation awareness, comprising:
   identifying physical data that includes data for a net or one or more shapes that are part of the net in a partial layout of the electronic circuit design, wherein the partial layout is incomplete to pass a layout versus schematic check;
   identifying or generating first simulation results of simulating a schematic design of the electronic circuit design with an electrical parasitic associated with the physical data;
   identifying modified physical data of the physical data in the electronic circuit design;
   simulating, with an aid of a parasitic aware simulation mechanism including or coupled with at least one processor of a computing system, the electronic circuit design by performing a second simulation on at least a portion of the schematic design with a new electrical parasitic or an updated electrical parasitic of the electrical parasitic to generate second simulation results;
   modifying at least a part of the partial layout based in part or in whole upon the second simulation results, wherein the electronic circuit design including the at least the part of the partial layout that has been modified is used to manufacture the electronic circuit.

2. The computer implemented method of claim 1, further comprising:
   modifying the schematic design or the layout of the electronic circuit design at least by comparing the first simulation results with the second simulation results.

3. The computer implemented method of claim 1, further comprising:
   identifying or creating the schematic design for the electronic circuit;
   identifying or generating a netlist from the schematic design; and
   mapping the electrical parasitic to the schematic design, wherein a first simulation that generates the first simulation results is performed by using the electrical parasitic that is mapped to the schematic design.

4. The computer implemented method of claim 1, further comprising at least one of:

comparing the second simulation results with the first simulation results;

generating a netlist directly from the partial layout of the electronic circuit without identifying or creating the schematic design of the electronic circuit;

comparing the first simulation results before the act of identifying the physical data with the second simulation results after the act of identifying the physical data;

improving a component parameter based at least in part upon a result of comparing the first simulation results with the second simulation results; and reducing the new electrical parasitic or the updated electrical parasitic to an approximate form or an alternative form.

5. The computer implemented method of claim 1, further comprising at least one of:

performing a sampling process on one or more transient simulation waveforms, and providing the one or more transient simulation waveforms that are sampled to a physical electronic circuit design tool; and assembling the electrical characteristic that is associated with the electrical parasitic, the updated electrical parasitic, or the new electrical parasitic, wherein simulations are performed at a first level using at least the electrical characteristic that is assembled.

6. The computer implemented method of claim 1, further comprising at least one of:

synchronizing a first data for the schematic design and a second data for the partial layout of the electronic circuit;

flattening a schematic hierarchy, and stitching the electrical parasitic to the schematic hierarchy that is flattened; and identifying the schematic hierarchy, performing a mapping or a binder process between the schematic design and the partial layout of the electronic circuit, and stitching the electrical parasitic to the schematic hierarchy that is hierarchical.

7. A system for implementing an electronic circuit design of an electronic circuit with simulation awareness, comprising:

at least one processor that executes a sequence of instructions;

a non-transitory computer accessible medium storing thereupon program code which, when executed by the at least one processor, causes the at least one processor to:

identify physical data that includes data for a net or one or more shapes that are part of the net in a partial layout of the electronic circuit design, wherein the partial layout is incomplete to pass a layout versus schematic check;

identify or generate first simulation results of simulating a schematic design of the electronic circuit design with an electrical parasitic associated with the physical data;

identify modified physical data of the physical data in the electronic circuit design;

simulate, with an aid of a parasitic aware simulation mechanism including or coupled with the at least one processor of a computing system, the electronic circuit design by performing a second simulation on at least a portion of the schematic design with new or updated electrical parasitic to generate second simulation results;

modify at least a part of the electronic circuit design based in part or in whole upon the second simulation results, wherein the electronic circuit design including the at least the part of the partial layout that has been modified is used to manufacture the electronic circuit.

8. The system of claim 7, in which the at least one processor further executes the program code to:

modify the schematic or the partial layout of the electronic circuit design at least by comparing the second simulation results with the first simulation results.

9. The system of claim 7, in which the at least one processor further executes the program code to:

identify or create the schematic design for the electronic circuit;

identify or generate a netlist from the schematic design; and map the electrical parasitic to the schematic design, wherein a first simulation generating the first simulation results is performed by using the electrical parasitic that is mapped to the schematic design.

10. The system of claim 7, in which the processor further executes the program code to:

compare the second simulation results with the first simulation results;

generate a netlist directly from partial layout without identifying or creating the schematic design;

compare the first simulation results before identifying the modified physical data and the second simulation results after the act of identifying the modified physical data;

improve a component parameter based at least in part upon a result of comparing the first simulation results and the second simulation results; or reduce the electrical parasitic to an approximate form or an alternative form.

11. The system of claim 7, in which the processor further executes the program code to:

perform a sampling process on one or more transient simulation waveforms, and providing the one or more transient simulation waveforms that are sampled to a physical electronic circuit design tool; or assemble the electrical characteristic that is associated with the electrical parasitic, the updated electrical parasitic, or the new electrical parasitic, wherein simulations are performed at a first level using at least the electrical characteristic that is assembled.

12. The system of claim 7, in which the processor further executes the program code to:

synchronize a first data for the schematic design and a second data for the partial layout of the electronic circuit;

flatten a schematic hierarchy, and stitching the electrical parasitic to the schematic hierarchy that is flattened; or identify the schematic hierarchy, performing a mapping or a binder process between the schematic design and the partial layout, and stitching the electrical parasitic to the schematic hierarchy that is hierarchical.

13. An article of manufacture comprising a non-transitory computer readable medium having stored thereupon a sequence of instructions which, when executed by at least one processor, causes the processor to execute a set of acts for implementing an electronic circuit design of an electronic circuit with simulation awareness, the set of acts comprising:

identifying physical data that includes data for a net or one or more shapes that are part of the net in a partial layout of the electronic circuit design, wherein the partial layout is incomplete to pass a layout versus schematic check;

identify or generate first simulation results of simulating a schematic design of the electronic circuit design with an electrical parasitic associated with the physical data;

identifying modified physical design data of the physical data in the electronic circuit design;

simulating, with an aid of a parasitic aware simulation mechanism including or coupled with at least one processor of a computing system, the electronic circuit design by performing a second simulation on at least a portion of the schematic design with new or updated electrical parasitic to generate second simulation results;

modifying at least a part of the electronic circuit design based in part or in whole upon the second simulation results, wherein the electronic circuit design including the at least the part of the partial layout that has been modified is used to manufacture the electronic circuit.

14. The article of manufacture of claim 13, the set of acts further comprising:

modifying the schematic or the partial layout at least by comparing the second simulation results with the first simulation results.

15. The article of manufacture of claim 13, the set of acts further comprising:

identifying or creating the schematic design for the electronic circuit;

identifying or generating a netlist from the schematic design; and mapping the electrical parasitic to the schematic design, wherein a first simulation generating the first simulation results is performed by using the electrical parasitic that is mapped to the schematic design.

16. The article of manufacture of claim 13, the set of acts further comprising at least one of:

comparing the second simulation results with the first simulation results;

generating a netlist directly from the partial layout without identifying or creating the schematic design of the electronic circuit;

comparing the first simulation results of the simulation before the act of identifying the physical data and the second results after the act of identifying the physical data;

improving a component parameter based at least in part upon a result of comparing the first results and the second simulation results; and reducing the electrical parasitic to an approximate form or an alternative form.

17. The article of manufacture of claim 13, the set of acts further comprising at least one of:

performing a sampling process on one or more transient simulation waveforms, and providing the one or more transient simulation waveforms that are sampled to a physical electronic circuit design tool; and assembling the electrical characteristic that is associated with the electrical parasitic, the updated electrical parasitic, or the new parasitic, wherein the simulation is performed at a first level using at least the electrical characteristic that is assembled.

18. The article of manufacture of claim 13, the set of acts further comprising at least one of:

synchronizing a first data for the schematic design and a second data for the partial layout;

flattening a schematic hierarchy, and stitching the electrical parasitic to the schematic hierarchy that is flattened; and identifying the schematic hierarchy, performing a mapping or a binder process between the schematic design and the partial layout, and stitching the electrical parasitic to the schematic hierarchy that is hierarchical.

19. A computer implemented method for implementing an electronic circuit design of an electronic circuit with simulation awareness, comprising:

identifying first physical data for a first net or one or more first shapes that are part of the first net in a partial layout of the electronic circuit design, wherein the partial layout is incomplete to pass a layout versus schematic check;

identifying or generating first simulation results of performing a first simulation on a schematic design of the electronic circuit design with a first electrical parasitic associated with the first physical data;

identifying second physical data for a second net or one or more second shapes that are part of the second net in the electronic circuit design;

simulating, with an aid of a parasitic aware simulation mechanism including or coupled with at least one processor of a computing system, the electronic circuit design by performing a second simulation on at least a portion of the schematic design with new electrical parasitic or an updated first electrical parasitic of the first electrical parasitic to generate second simulation results;

modifying at least a part of the electronic circuit design based in part or in whole upon the second simulation results, wherein the electronic circuit design including the at least the part of the partial layout that has been modified is used to manufacture the electronic circuit.

20. The computer implemented method of claim 19, further comprising:

identifying or creating the schematic design for the electronic circuit;

identifying or generating a netlist from the schematic design;

mapping one or more electrical parasitics to the schematic design, wherein the first simulation is performed by using the one or more electrical parasitics that are mapped to the schematic design; and modifying the schematic design or the partial layout at least by comparing the first simulation results with the second simulation results.

21. The computer implemented method of claim 19, further comprising at least one of:

generating a netlist directly from the partial layout without identifying or creating the schematic design;

comparing the first simulation results with the second simulation results;

improving a component parameter based at least in part upon a part of the first simulation results or the second simulation results; and reducing the first electrical parasitic or the second electrical parasitic to an approximate form or an alternative form.

22. A system for implementing an electronic circuit design of an electronic circuit with simulation awareness, the system comprising:

at least one processor that executes a sequence of instructions;

a non-transitory computer accessible medium storing thereupon program code which, when executed by the at least one processor, causes the at least one processor to:

identify first physical data for a first net or one or more first shapes that are part of the first net in a partial layout of the electronic circuit design, wherein the partial layout is incomplete to pass a layout versus schematic check;

identify or generate first simulation results of performing a first simulation on a schematic design of the electronic circuit design with a first electrical parasitic associated with the first physical data;

identify second physical data for a second net or one or more second shapes that are part of the second net;

simulate, with an aid of a parasitic aware simulation mechanism including or coupled with at least one processor of a computing system, the electronic circuit design by performing a second simulation on at least a portion of the schematic design with new electrical parasitic or an updated first electrical parasitic of the first electrical parasitic to generate second simulation results;

modify at least a part of the electronic circuit design based in part or in whole upon the second simulation results, wherein the electronic circuit design including the at least the part of the partial layout that has been modified is used to manufacture the electronic circuit.

23. The system of claim 22, wherein the at least one processor further executes the sequence of instructions to:

identify or create the schematic design for the electronic circuit;

identify or generate a netlist from the schematic design;

map one or more electrical parasitics to the schematic design, wherein the first simulation is performed by using the one or more electrical parasitics that are mapped to the schematic design; and modify the schematic design or the partial layout at least by comparing the first simulation results with the second simulation results.

24. The system of claim 22, wherein the at least one processor further executes the sequence of instructions to:

generate a netlist directly from the partial layout without identifying or creating the schematic design;

compare the first simulation results with the second simulation results;

improve a component parameter based at least in part upon a part of the first simulation results or the second simulation results; or reduce the first electrical parasitic or the second electrical parasitic to an approximate form or an alternative form.

25. An article of manufacture comprising a non-transitory computer readable storage medium having stored thereupon a sequence of instructions which, when executed by at least one computer processor, cause the at least one processor to execute a set of acts for implementing an electronic circuit design of an electronic circuit with simulation awareness, the set of acts comprising:

identifying first physical data for a first net or one or more first shapes that are part of the first net in a partial layout of the electronic circuit design, wherein the partial layout is incomplete to pass a layout versus schematic check;

identify or generate first simulation results of performing a first simulation on a schematic design of the electronic circuit design with a first electrical parasitic associated with the first physical data;

identifying second physical data for a second net or one or more second shapes that are part of the second net in the electronic circuit design;

simulating, with an aid of a parasitic aware simulation mechanism including or coupled with at least one processor of a computing system, the electronic circuit design by performing a second simulation on at least a portion of the schematic design with new electrical parasitic or an updated first electrical parasitic of the first electrical parasitic to generate second simulation results;

modifying at least a part of the electronic circuit design based in part or in whole upon the second simulation results, wherein the electronic circuit design including the at least the part of the partial layout that has been modified is used to manufacture the electronic circuit.

26. The article of manufacture of claim 25, the set of acts further comprising:

identifying or creating the schematic design for the electronic circuit;

identifying or generating a netlist from the schematic design;

mapping one or more electrical parasitics to the schematic design, wherein the first simulation is performed by using the one or more electrical parasitics that are mapped to the schematic design; and modifying the schematic design or the partial layout at least by comparing the first simulation results with the second simulation results.

27. The article of manufacture of claim 25, the set of acts further comprising at least one of:

generating a netlist directly from the partial layout without identifying or creating the schematic design of the electronic circuit;

comparing the first simulation results with the second simulation results;

improving a component parameter based at least in part upon a part of the first simulation results or the second simulation results; and reducing the first electrical parasitic or the second electrical parasitic to an approximate form or an alternative form.

* * * * *